US012805285B2

(12) United States Patent
Polomoff et al.

(10) Patent No.: US 12,805,285 B2
(45) Date of Patent: Nov. 17, 2026

(54) ACTIVE PRIME REGION WITH CONDUCTIVE BYPASS

(71) Applicant: International Business Machines Corporation, Armonk, NY (US)

(72) Inventors: Nicholas Alexander Polomoff, Hopewell Junction, NY (US); Brent A. Anderson, Jericho, VT (US); Lawrence A. Clevenger, Saratoga Springs, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 18/476,816

(22) Filed: Sep. 28, 2023

(65) Prior Publication Data

US 2025/0112121 A1 Apr. 3, 2025

(51) Int. Cl.

| | |
|---|---|
| ***H01L 23/48*** | (2006.01) |
| ***H01L 21/768*** | (2006.01) |
| ***H01L 23/00*** | (2006.01) |
| ***H10W 20/00*** | (2026.01) |
| ***H10W 20/20*** | (2026.01) |
| *H10W 72/20* | (2026.01) |
| *H10W 90/00* | (2026.01) |

(52) U.S. Cl.
CPC ......... *H10W 20/20* (2026.01); *H10W 20/023* (2026.01); *H10W 72/20* (2026.01); *H10W 90/792* (2026.01)

(58) Field of Classification Search
CPC ............................ H01L 23/481; H10W 20/20
See application file for complete search history.

(56) References Cited

U.S. PATENT DOCUMENTS

| | | | | |
|---|---|---|---|---|
| 6,162,686 | A * | 12/2000 | Huang ................ | H10W 20/494 438/281 |
| 9,059,167 | B2 | 6/2015 | Farooq et al. | |
| 9,570,322 | B2 | 2/2017 | Su et al. | |
| 9,570,395 | B1 | 2/2017 | Sengupta et al. | |
| 9,711,501 | B1 | 7/2017 | Basker et al. | |
| 10,256,219 | B2 | 4/2019 | Chew | |
| 10,586,765 | B2 | 3/2020 | Smith et al. | |
| 10,636,739 | B2 | 4/2020 | Beyne et al. | |
| 10,700,207 | B2 | 6/2020 | Chen et al. | |
| 10,748,901 | B2 | 8/2020 | Rubin et al. | |
| 10,867,925 | B2 * | 12/2020 | Jeng ........................ | H10P 54/00 |
| 10,892,215 | B2 | 1/2021 | Nelson et al. | |
| 10,903,165 | B2 | 1/2021 | Rubin et al. | |
| 11,037,873 | B2 | 6/2021 | Polomoff et al. | |
| 11,133,254 | B2 | 9/2021 | Lai et al. | |
| 11,335,657 | B2 | 5/2022 | Colgan et al. | |
| 2007/0132059 | A1 * | 6/2007 | Tsai .................... | H01L 23/5258 257/E23.15 |

(Continued)

*Primary Examiner* — Peter Bradford
(74) *Attorney, Agent, or Firm* — Harrity & Harrity, LLP

(57) ABSTRACT

A semiconductor device includes a prime active region and a barrier region within the active prime region to define a barrier across a depth of the active prime region. A bypass structure includes a contact connecting to a component within the active prime region and extending outside the active prime region, a metal layer connecting to the first contact outside the active prime region and a through via passing through the depth of the active prime region and connecting to a solder bump.

20 Claims, 19 Drawing Sheets

(56) References Cited

U.S. PATENT DOCUMENTS

| | | | | |
|---|---|---|---|---|
| 2008/0042292 | A1* | 2/2008 | Adkisson | H10W 42/00 257/773 |
| 2011/0193197 | A1 | 8/2011 | Farooq et al. | |
| 2012/0292777 | A1 | 11/2012 | Lotz | |
| 2020/0105671 | A1 | 4/2020 | Lai et al. | |
| 2020/0161267 | A1* | 5/2020 | Jeng | H10P 72/74 |
| 2020/0235091 | A1* | 7/2020 | Kang | H01L 23/481 |
| 2021/0066329 | A1* | 3/2021 | Ito | G11C 5/025 |
| 2021/0111115 | A1 | 4/2021 | Morrow et al. | |
| 2021/0356514 | A1* | 11/2021 | Polomoff | G01R 31/2884 |
| 2022/0192042 | A1 | 6/2022 | Kabir et al. | |
| 2022/0308297 | A1 | 9/2022 | Polomoff et al. | |
| 2022/0310483 | A1* | 9/2022 | Chang | H01L 23/481 |
| 2023/0377968 | A1* | 11/2023 | Chuang | H10W 10/0145 |
| 2024/0206193 | A1* | 6/2024 | Wang | H10B 80/00 |
| 2025/0038074 | A1* | 1/2025 | Hsiao | H10W 20/023 |

* cited by examiner

ACTIVE PRIME REGION WITH CONDUCTIVE BYPASS

BACKGROUND

The present invention generally relates to semiconductor devices and processing methods, and more particularly to semiconductor devices having a signal or power delivery circuit to bypass protective structures in semiconductor device packaging.

Integrated circuit devices are constructed by forming diffusion regions in a substrate and then building up wiring connections from the substrate through to a back end of line (BEOL) structure. Such devices present a diffusion region (e.g., source/drain region) on one side of the device formed in the substrate, and a contact is dropped down to connect with the diffusion region. Metal lines connect to the contacts and are themselves connected by other contacts and metal lines to form a metal structure in accordance with a chip design. This region of a device is referred to as an active prime region. Active prime regions have protective structures, such as, crackstops that reduce the chances of catastrophic cracks propagating through the active prime region and guard rings that help to protect edges of the semiconductor device and prevent electrostatic discharge and/or parasitic electrical losses. These protective structures prevent lateral connections to the active prime region since these protective structures form a hermetic or impenetrable barrier around an outside perimeter of the device.

SUMMARY

In accordance with an embodiment of the present invention, a semiconductor device includes a prime active region and a barrier region within the active prime region to define a barrier across a depth of the active prime region. A bypass structure includes a contact connecting to a component within the active prime region and extending outside the active prime region. A metal layer connects to the first contact outside the active prime region, and a through via passes through the depth of the active prime region and connects to a solder bump.

In accordance with another embodiment of the present invention, a semiconductor device includes a prime active region and a barrier region within the active prime region to define a barrier across a depth of the active prime region and including at least a crackstop. An outside bypass structure includes a contact connecting to a component within the active prime region and extending outside the active prime region. A metal layer connects to the first contact outside the active prime region, and a through via passes through the depth of the active prime region outside the barrier region and connects to a solder bump.

In accordance with another embodiment of the present invention, a method for fabricating a semiconductor device includes forming a contact through a first carrier substrate to connect to a component within an active prime region, the contact extending outside the active prime region, the active prime region including barrier region to define a barrier across a depth of the active prime region. A through hole is opened through a depth of the prime active region and the first carrier. The through hole is filled to form a through via passing through the depth of the active prime region and the first carrier. One or more metal layers are formed on the first carrier to connect to the contact and the through via outside the active prime region. A solder bump connection is formed to the through via wherein the contact, the through via and one or more metal layers form a bypass structure to provide access to the active prime region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
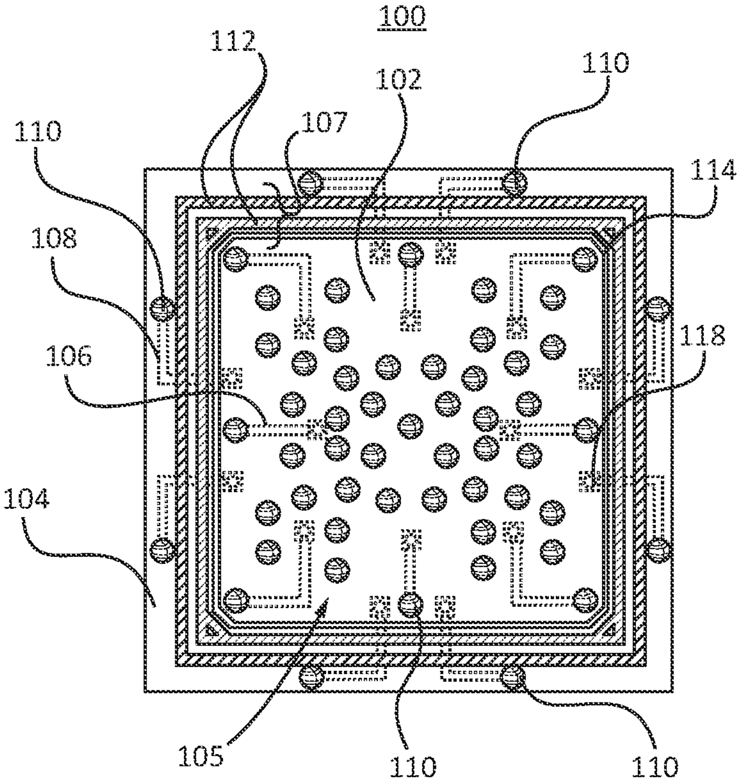
FIG. 1 shows a top layout view of a semiconductor chip showing solder bumps and a barrier region surrounding a prime active region, in accordance with an embodiment of the present invention.

In accordance with embodiments of the present invention, devices and methods are described which include semiconductor devices having electrical paths that extend beyond and through protective barriers disposed about a chip. In one illustrative embodiment, a packaged chip can include barriers and rings that circumscribe a periphery of a chip. These barriers and rings are often impenetrable and do not permit electrical connections through these barriers and rings. It is often the case that solder bumps on a top surface of a chip are the only electrical access point for the chip. These solder bumps make connections to other structures such as leads or other chips.

In useful embodiments, the barriers and rings can include, for example, a crack stop barrier wall that surrounds a periphery of a chip, a guard ring that surrounds the chip to provide grounding or electrical protection, a die seal, seal ring or edge seal structure which can secure and protect the chip in its housing or carrier.

In one embodiment, a chip includes a backside power distribution network with substantially sized wires that can deliver power to a backside redistribution layer (RDL) using at least one through silicon via (TSV) permitting for a bypass of any hermetic or Chip/Package Interactions (CPI) sealing of a crackstop barrier or other structures. An RDL is a layer of wiring metal interconnects that redistribute signal access to different parts of the chip. In one embodiment, the TSV permits a connection that bypasses the crackstop barrier and other structures into an active device region, e.g., the TSV connects to the RDL and/or a secondary TSV (e.g., through a carrier substrate) to create the bypass connection. The power RDL wire can connect two TSVs that go across back end of line (BEOL) dielectric levels and a carrier substrate.

In one embodiment, the bypass connection bypasses epitaxy layers in the chip, and an electrical connection is made to a buried power rail. Different contact structures can be employed to pass through the epitaxial layer of the chip, e.g., source/drain (S/D) contacts, recessed S/D contact, via to buried power rail (VBPR), which forms silicide at a sidewall of the epitaxial material, etc. The bypass passes through the active device layers and connects to a backside of an active prime region to bypass the impenetrable crack-stop wall barrier (or other structure) on an underside of the active prime region.

In accordance with embodiments of the present invention, conductive paths are provided that bypass protective features to permit connections from an exterior portion outside an active prime region to regions within the active prime region, including other conductive paths, conductive components, transistors, etc. In addition, connections can be made to other chips or devices. The conductive paths permit connections that would otherwise be impermissible due to the presence of hermetically sealed protective features, such as, crackstops, guard rings, etc. In addition, connections can be internal and provided fully within the active prime region.

In a useful embodiment, a backside electrical or power signal delivery structure for a backside power delivery network (BSPDN) can bypass a continuous impenetrable hermetic crackstop barrier and can be used for power distribution or electrical signal transmission. The delivery structure can be made of rows of outer or inner bumps-to-TSVs dedicated to signals/communication chip to chip, or can have TSVs connected to an RDL wiring level and smaller TSV built in/through a carrier substrate. The TSVs can have different orientations (e.g., up or down). The delivery structure can have one or more TSVs that bridge through the BEOL dielectric layers, the active device layers and a carrier substrate. A RDL level connects the one or more TSVs to a secondary TSV where the secondary TSV bridges through, e.g., a carrier wafer and connects to a buried wiring level, a transistor device with S/D epi or a power distribution network under the transistor device and separated by a dielectric layer.

In one embodiment, the power distribution network includes two TSVs, a backside RDL and a power wire, where a via trench contact connects the S/D of the transistor to the buried power rail (BPR). The BPR is connected to power wires through buried vias, and power wires are connected to the BEOL wires. Recessed contacts can be employed to connect epi and VBPR to BPR. BEOL wires can be connected to a bottom power wire through the bypass.

Embodiments of the present invention can be employed in any type of semiconductor device or chip. For example, the present embodiments can include input/output (IO) circuits, high performance computing (HPC) circuits, clock buffers, processors, memory devices or any other integrated circuit chip or combinations thereof. Adding additional conductive paths to a device in accordance with embodiments of the present invention can be integrated into any fabrication process with minimal or no impact on expense or processing time.

Referring now to the drawings in which like-numerals represent the same or similar elements and initially to FIG. 1, a top view of a semiconductor device or chip 100 is shown in accordance with an embodiment of the present invention. The semiconductor device or chip 100 includes an active prime region 102. The active prime region 102 includes active semiconductor structures including transistors, metal structures dielectric layers, epitaxial regions, etc. A top layer of the active prime region 102 shows far back end of line (FBEOL) dielectric layers 105. Solder bumps 110 are formed on contacts that pass through the dielectric layer 105. The active prime region 102 is circumscribed by a barrier region 107 that includes one or more rings or barriers, e.g., a guard ring 114, a seal ring or edge seal or a crackstop barrier 112 (a two-rail crackstop is shown in FIG. 1), etc. In some embodiments, all or some of these barriers are present. In other embodiments, a combination of these and/or other barriers can be employed. An exterior region 104 include the layers and materials of the active prime region 102 but is outside the barrier region 107.

The semiconductor device or chip 100 includes outside bypasses 108 and inside bypasses 106. Outside bypasses 108 include a through silicon via (TSV) 120 that connects to a component or metal structure within the active prime region 102 and then connects to a metal line or redistribution line (RDL) to connect to another contact or TSV or other conductive structure outside the confines of the active prime region 102. Inside bypasses 106 include a through silicon via (TSV) 120 that connects to a component or metal structure within the active prime region 102 and then connects to a metal line or redistribution line (RDL) to connect to another contact or TSV or other conductive structure inside the confines of the active prime region 102. Both the inside and outside bypasses, 106, 108 exit the active prime region 102. The outside bypasses 108 exit a depth of the active prime region 102 and are positioned outside the barrier region 107, while inside bypasses 106 exit the depth of the active prime region 102 and are positioned with the barrier region 107.

Any number of outside bypasses 108 and inside bypasses 106 can be employed. The outside bypasses 108 and inside bypasses 106 can be employed to connect the present semiconductor device or chip 100 to other chips. In one embodiment, the outside bypasses 108 and inside bypasses 106 are employed to connect signal or power to the semiconductor device or chip 100. In another embodiment, the outside bypasses 108 and inside bypasses 106 can be employed to connect to a single or specific component of the semiconductor device or chip 100.

Figure 2:
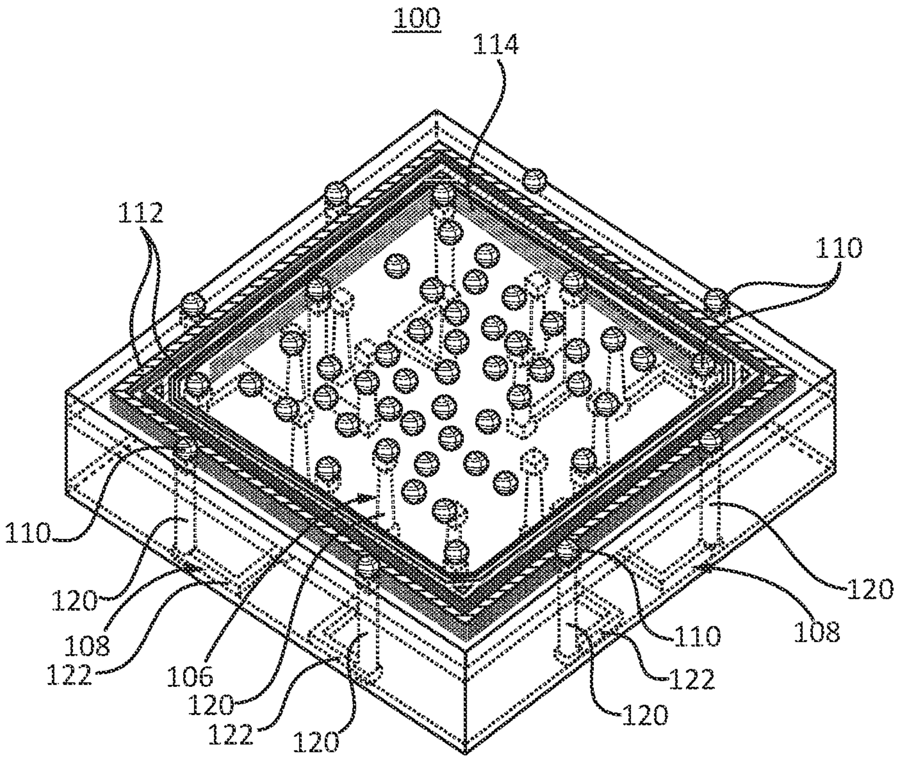
FIG. 2 shows a perspective view of the semiconductor chip of FIG. 1 showing solder bumps, inside bypasses and outside bypasses relative to the barrier region surrounding the prime active region, in accordance with an embodiment of the present invention.

Referring to FIG. 2, a perspective view of the semiconductor device or chip 100 is shown in accordance with an embodiment of the present invention. Outside bypasses 108 are shown making a connection between a solder bump 110 through a TSV 120 to connect to an RDL 122. The RDL 122 then connects to another TSV, contact, solder bump, component or metal structure within the semiconductor device or chip 100. The outside bypasses 108 provide a conductive path or connection that circumvents the crackstop barrier 112 and any other peripheral barriers present.

Figure 3:
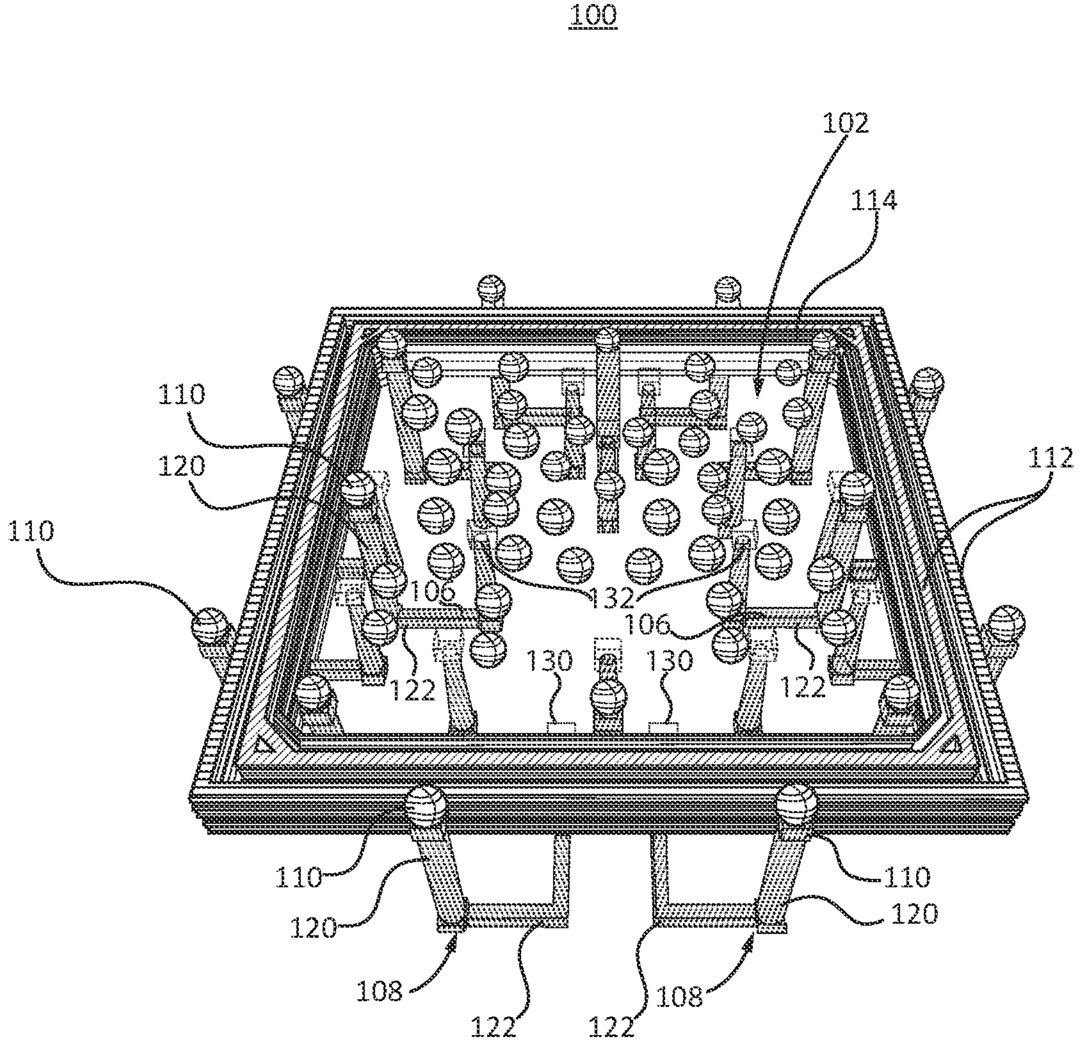
FIG. 3 shows a perspective view of a semiconductor chip with prime active region materials removed and showing solder bumps, inside bypasses and outside bypasses relative to the barrier region surrounding the prime active region, in accordance with an embodiment of the present invention.

Referring to FIG. 3, a perspective view of the semiconductor device or chip 100 is shown in accordance with an embodiment of the present invention. The semiconductor device or chip 100 is depicted showing solder bumps 110, outside bypasses 108 and inside bypasses 106 relative to the crackstop barrier 112 and guard ring 114. Other material of the active prime region 102 has been removed to better depict the structure and connection of the outside bypasses 108 and inside bypasses 106.

Outside bypasses 108 and inside bypasses 106 include at least one TSV 120, which connects a solder bump 110 to a contact 130, 132 or other structure in the active prime region 102 by RDL 122. Contact 130 corresponds with outside bypasses 108 and can include any structure within the chip 100, e.g., S/D regions, another contact, a TSV, etc. Contact 132 corresponds with inside bypasses 106 and can include any structure within the chip 100, e.g., an S/D region, another contact a TSV, etc.

Figure 4:
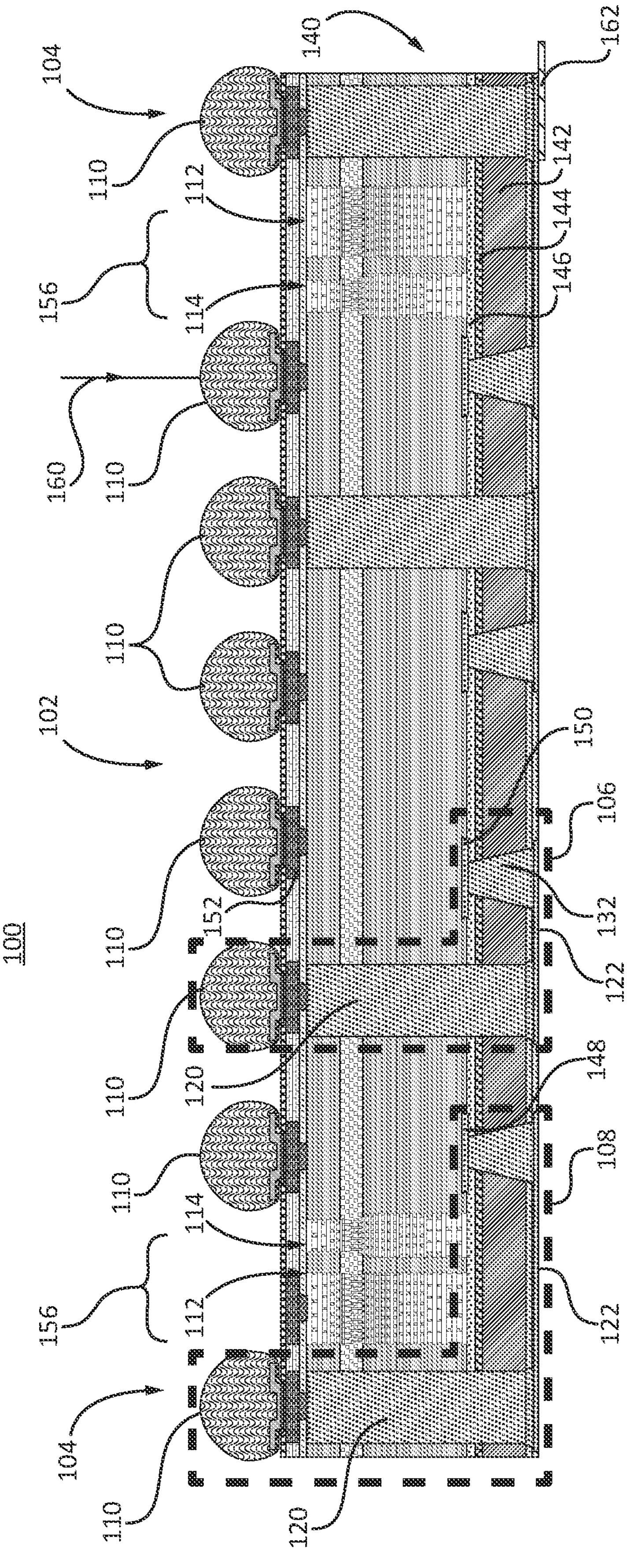
FIG. 4 shows a cross-sectional view of a semiconductor chip showing solder bumps, inside bypasses and outside bypasses relative to a barrier region surrounding a prime active region, in accordance with an embodiment of the present invention.

Referring to FIG. 4, a cross-sectional view of the semiconductor device or chip 100 is shown in accordance with an embodiment of the present invention. The semiconductor device or chip 100 is depicted showing bypass circuitry including outside bypasses 108 and inside bypasses 106 relative to, e.g., the crackstop barrier 112 and guard ring 114. Outside bypasses 108 provide a conductive path from region 104 outside a barrier region 156 to within the active prime region 102, and more particularly to an on-chip conductive component. The barrier region 156 can include, e.g., the crackstop barrier 112 and guard ring 114. Inside bypasses 106 provide a conductive path from a position off-chip to a position within the active prime region 102, and more particularly to an on-chip conductive component.

Outside bypass 108 connects a solder bump 110 to a component 148 located within the active prime region 102. A conductive path for outside bypass 108 includes TSV 120, RDL 122, contact 130. In one embodiment, the TSV 120 passes through a carrier substrate 142, bonding layer 144 and capping layer 146. The contact 130 also passes through the carrier substrate 142, bonding layer 144 and capping layer 146 into BEOL layers 140 to make contact with component 148. Component 148 can include an epitaxial layer, a semiconductor active region, a metal structure, another contact, a TSV, a redistribution network or any other structure that would benefit from a bypass connection. In one embodiment, contact 130 can pass through active device layers, a semiconductor substrate and make contact with metal structures 152 on a top side of the chip 100 or make contact with buried metal structures anywhere within the active prime region 102 at any depth or position.

Inside bypass 106 connects a solder bump 110 to a component 150 located within the active prime region 102 and still within the barrier region 156. A conductive path for inside bypass 106 includes TSV 120, RDL 122, contact 132. In one embodiment, the TSV 120 passes through a carrier substrate 142, bonding layer 144 and capping layer 146. The contact 132 also passes through the carrier substrate 142, bonding layer 144 and capping layer 146 into BEOL layers 140 to make contact with component 150. Component 150 can include an epitaxial layer, a semiconductor active region, a metal structure, another contact, a TSV, a redistribution network or any other structure that would benefit from a bypass connection. In one embodiment, contact 132 can pass through active device layers, a semiconductor substrate and make contact with metal structures 152 on a top side of the chip 100 or make contact with buried metal structures anywhere within the active prime region 102 at any depth or position.

In one embodiment, outside bypasses 108 and inside bypasses 106 can be employed in a power distribution network (PDN), and in particular a backside PDN (BSPDN). In such an embodiment, power can be distributed to one or more TSVs 120 to RDL 122 and a power wire 160. The power wire 160 can connect to a solder bump 110 and/or include a power rail 162 or contact pad for connecting to one or more TSVs 120 or to RDL 122. In one embodiment, the power rail 162 can be buried within the layers of the chip in the active prime region 102. Here, the power distribution network can include a via trench contact that connects a S/D of a transistor to the buried power rail (BPR). The BPR can be connected to power wires through buried vias, and power wires can be connected to BEOL wires. Recessed contacts can be employed to connect epi and VBPR to BPR. BEOL wires can be connected to a bottom power wire through the bypass.

Figure 5:
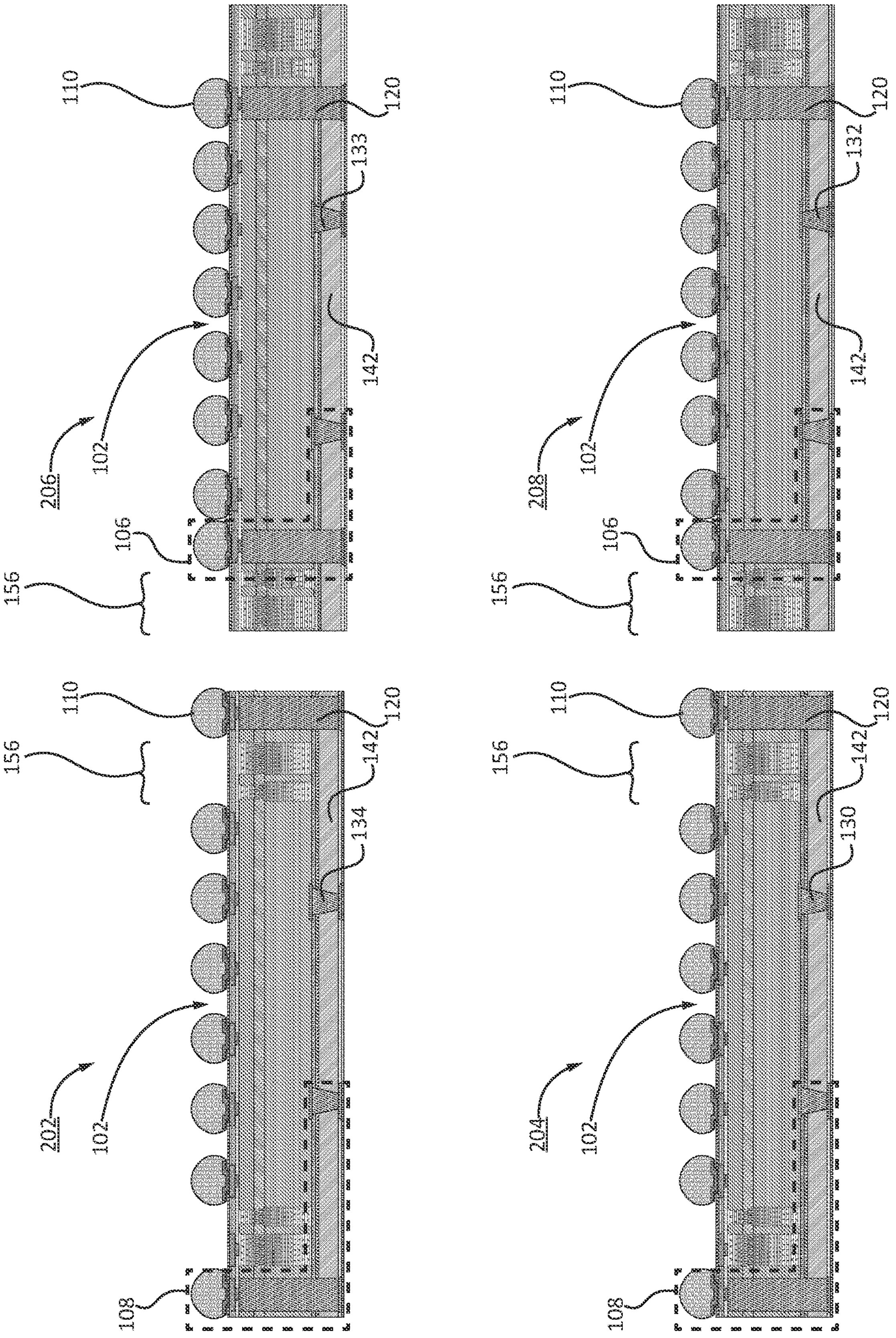
FIG. 5 shows cross-sectional views of semiconductor chips showing variations of outside bypasses and inside bypasses relative to a barrier region surrounding a prime active region, in accordance with an embodiment of the present invention.

Referring to FIG. 5, cross-section views showing variations of packaged chips with outside bypasses only and inside bypasses only illustratively depicted. In one embodiment, a packaged chip 202 includes outside bypasses 108. The outside bypasses 108 have downward facing contacts 131. Downward facing contacts 131 are formed through the carrier substrate 142 away from the active prime region 102. In another embodiment, a packaged chip 204 also includes outside bypasses 108. The outside bypasses 108 have upward facing contacts 130. The upward facing contacts 130 are formed through the carrier substrate 142 toward the active prime region 102.

In one embodiment, a packaged chip 206 includes inside bypasses 106. The inside bypasses 106 have downward facing contacts 133. Downward facing contacts 133 are formed through the carrier substrate 142 away from the active prime region 102. In another embodiment, a packaged chip 208 also includes inside bypasses 106. The inside bypasses 106 have upward facing contacts 132. The upward facing contacts 132 are formed through the carrier substrate 142 toward the active prime region 102.

Figure 6:
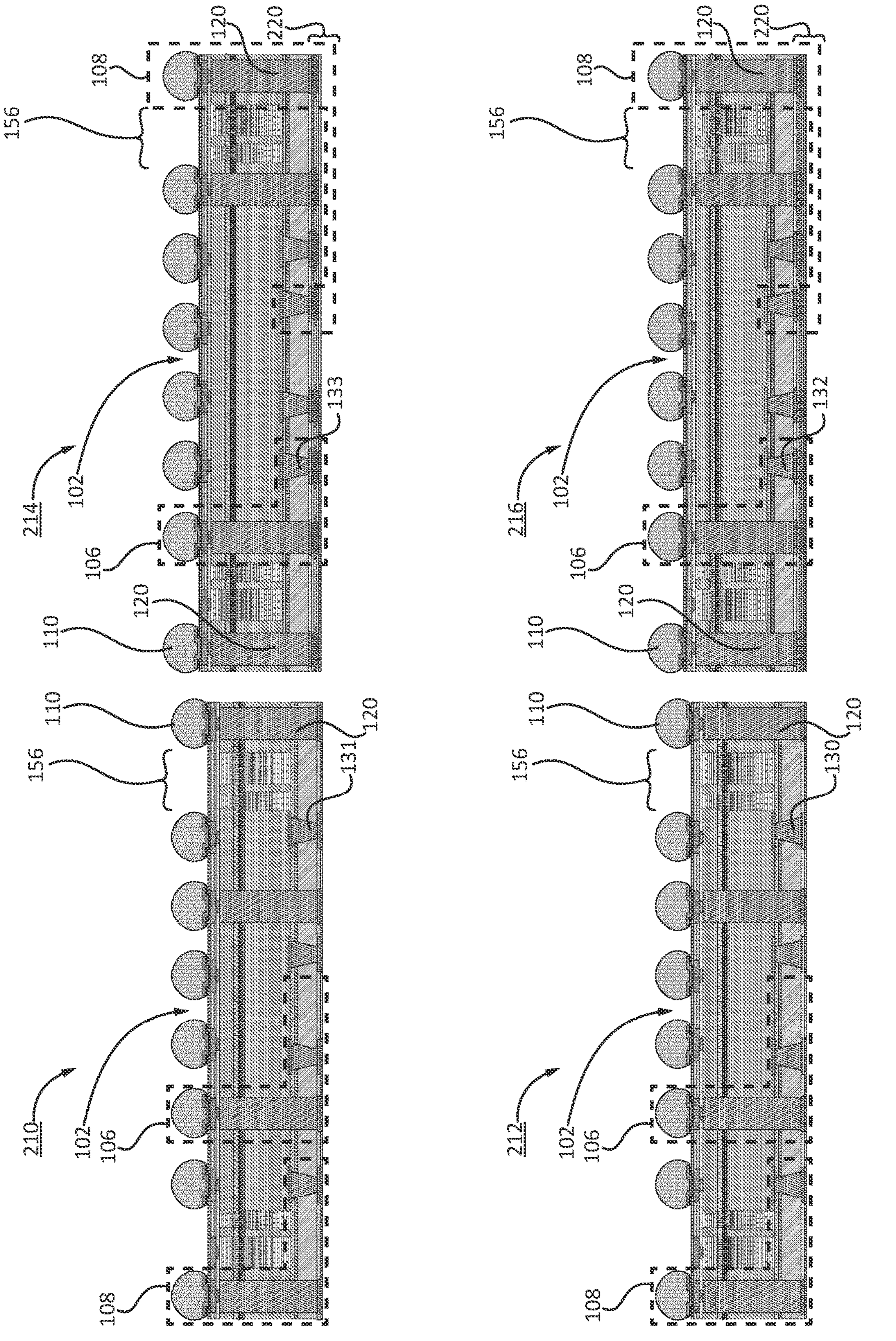
FIG. 6 shows cross-sectional views of semiconductor chips showing variations of combinations of outside bypasses and inside bypasses relative to a barrier region surrounding a prime active region, in accordance with an embodiment of the present invention.

Referring to FIG. 6, cross-section views showing variations of packaged chips with combinations of inside and outside bypasses illustratively depicted. In one embodiment, a packaged chip 210 includes outside bypasses 108 and inside bypasses 106. The chip 210 includes downward facing contacts 131. Downward facing contacts 131 are formed through the carrier substrate 142 away from the active prime region 102. In another embodiment, a packaged chip 212 also includes outside bypasses 108 and inside bypasses 106. The chip 212 includes upward facing contacts 130. The upward facing contacts 130 are formed through the carrier substrate 142 toward the active prime region 102.

In one embodiment, a packaged chip 214 includes outside bypasses 108 and inside bypasses 106. The chip 214 includes downward facing contacts 131. Downward facing contacts 131 are formed through the carrier substrate 142 away from the active prime region 102. Downward facing contacts 131 are formed on multiple metal levels 220 so that connections to TSVs 120 for outside bypasses 108 and inside bypasses 106 can overlap with a same footprint. In another embodiment, a packaged chip 216 also includes outside bypasses 108 and inside bypasses 106. The chip 216 includes upward facing contacts 130. The upward facing contacts 130 are formed through the carrier substrate 142 toward the active prime region 102. Downward facing contacts 131 are formed on multiple metal levels 220 so that connections to TSVs 120 for outside bypasses 108 and inside bypasses 106 can overlap with a same footprint.

Referring to FIGS. 7-19, a method for fabricating a chip with one or more bypasses and having downward contacts is shown in accordance with one illustrative embodiment. This method provides a bypass connection first before formation of semiconductor processing to form an electronic device.

Figure 7:
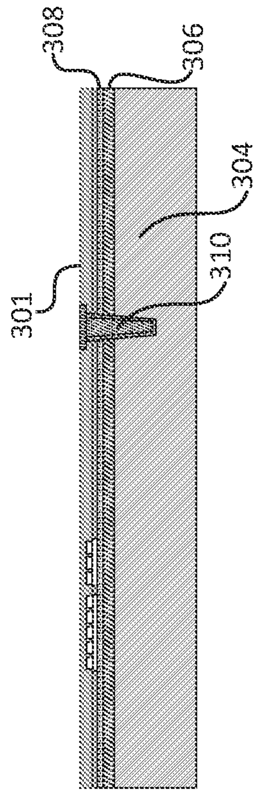
FIG. 7 shows a cross-sectional view of a first carrier substrate having a contact or TSV formed therein in a bypass connection first method, in accordance with an embodiment of the present invention.

Referring to FIG. 7, a carrier substrate 304 can be bonded with an adhesive 306 to a capping layer 308 (and other layers 301). A contact or through silicon via (TSV) 310 is formed by patterning a mask, etching a contact hole through the semiconductor substrate 302 and into the carrier substrate 304. The contact hole can include a liner material. The liner material can include a diffusion barrier, e.g., TaN, TiN, or the like and a seed layer, which will assist in electrodepositing conductive material in next steps. Liner material is conformally deposited therein in one or two layers followed by a conductor fill and a planarization process (e.g., chemical mechanical polishing (CMP).

Figure 8:
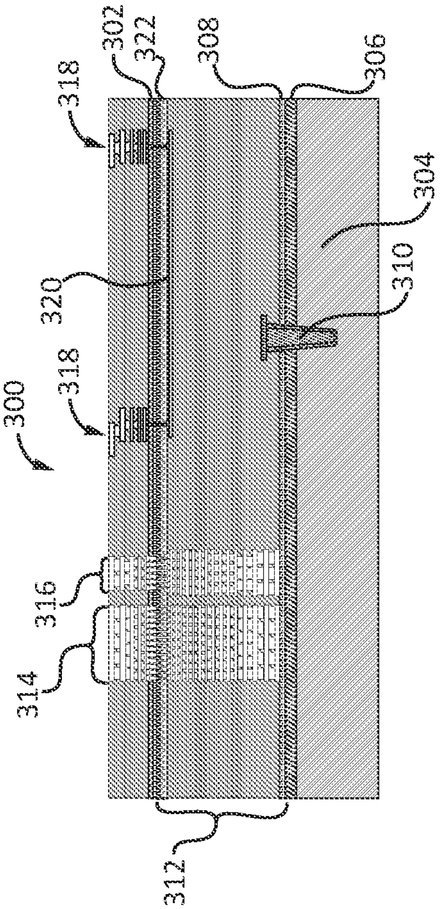
FIG. 8 shows a cross-sectional view of the first carrier substrate of FIG. 7 having a prime active region a semiconductor device formed with barrier structures, in accordance with an embodiment of the present invention.

Referring to FIG. 8, after forming the TSV 310, processing of a semiconductor device 300 can continue in accordance with a process of record and in accordance with a device type being manufactured. For example, a nanosheet or nanosheets 322 can be applied to a semiconductor substrate 302 and/or a power distribution network 318 with a buried power rail 320 can be fabricated, as needed. In addition, barrier protection features, such as a crackstop 314 and/or a guard ring 316 are formed. The semiconductor substrate 302 can include any suitable substrate structure, e.g., a bulk semiconductor, a semiconductor-on-insulator (SOI) substrate, etc., and preferably includes a monocrystalline semiconductor. In one example, the semiconductor substrate 302 can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Semiconductor components, e.g., active regions, such as source/drain regions (S/D regions), gate structures, capacitor plates, memory elements, etc. are formed. Other components can include other electronic and electrical components. Metal structures within dielectric protection layers are also formed.

Figure 9:
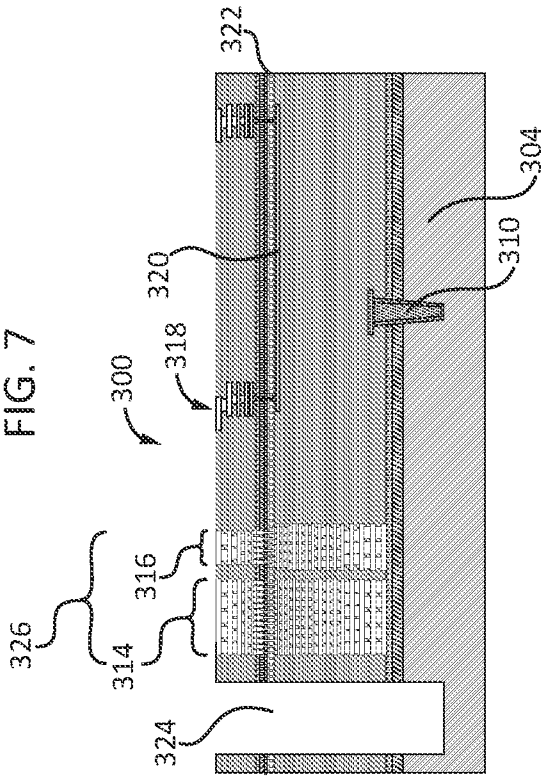
FIG. 9 shows a cross-sectional view of the semiconductor device of FIG. 8 having a TSV hole formed through the prime active region depth outside the barrier structures, in accordance with an embodiment of the present invention.

Referring to FIG. 9, a contact hole 324 is patterned and etched into the semiconductor device 300. The contact hole 324 can be formed by masking the device 300 and etching the contact hole 324 using an anisotropic etch, such as e.g., reactive ion etching (RIE). Note that in the present example, the contact hole 324 is formed outside a barrier region 326 that includes the crackstop 314 and the guard ring 316. In this way, the contact hole 324 is intended for the formation of an outside bypass structure.

Figure 10:
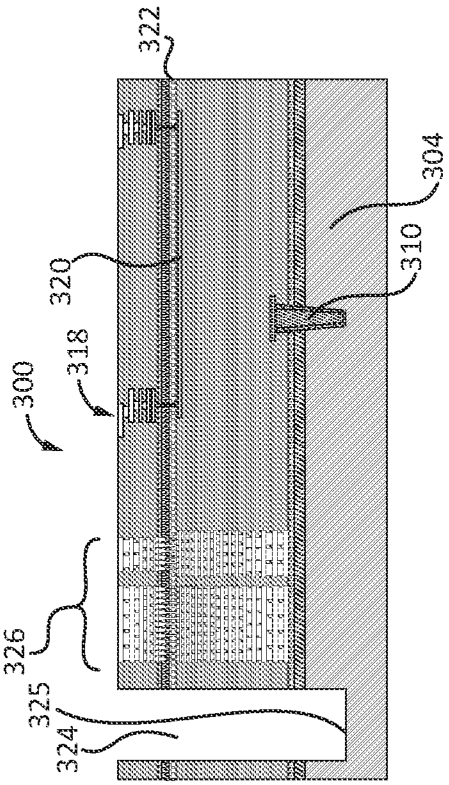
FIG. 10 shows a cross-sectional view of the semiconductor device of FIG. 9 having a liner material formed in the TSV hole, in accordance with an embodiment of the present invention.

Referring to FIG. 10, the contact hole 324 is prepared by sputtering a liner material 325 therein. The liner material 325 can include a diffusion barrier, e.g., TaN, TiN, or the like and a seed layer, which will assist in the formation of a large TSV to be formed. The seed layer is particularly useful in electroplating processes, which is a useful deposition process especially for a large sized contacts. The seed layer provides initiation sites for metal growth during the electroplating process.

Figure 11:
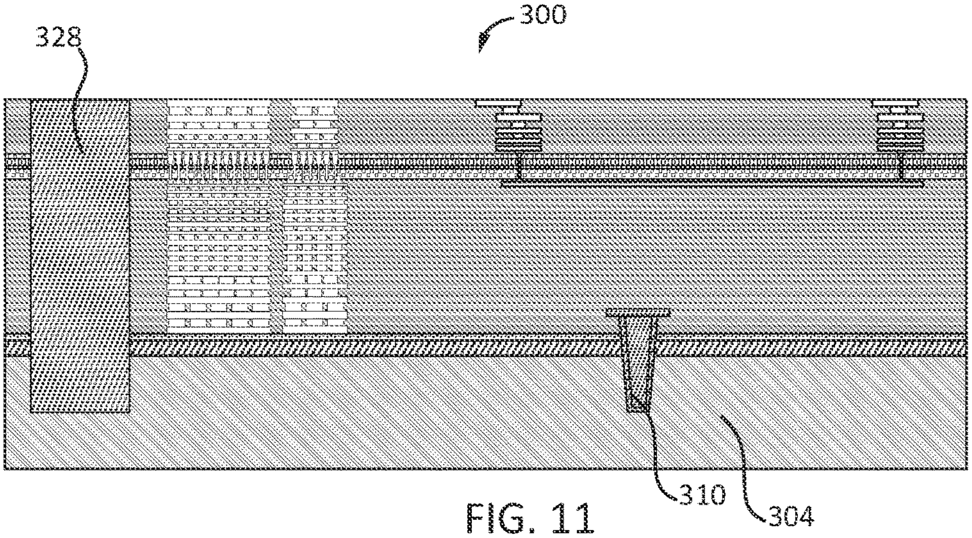
FIG. 11 shows a cross-sectional view of the semiconductor device of FIG. 10 having a TSV formed, in accordance with an embodiment of the present invention.

Referring to FIG. 11, the contact hole 324 is filled with a suitable conductive material. The conductive material can include a metal that can be deposited using, e.g., an electroplating process, although other deposition processes are contemplated. In one embodiment, electroplating can include copper, silver, gold, nickel or any suitable combinations of these and other metals. After deposition, a planarization process is performed, e.g., CMP, to form the TSV 328.

Figure 12:
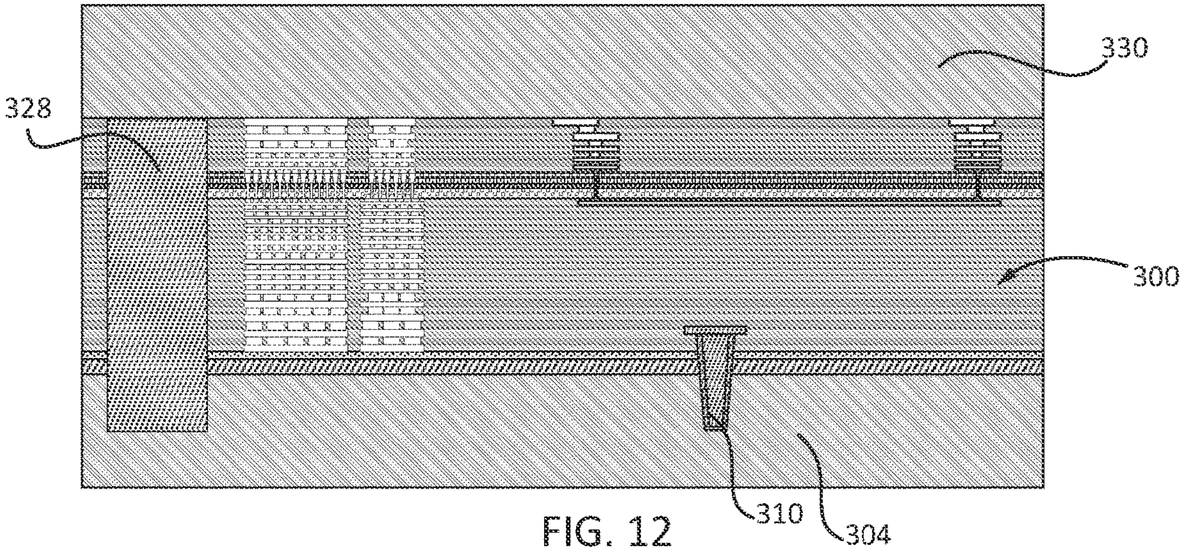
FIG. 12 shows a cross-sectional view of the semiconductor device of FIG. 11 having a second carrier bonded to the semiconductor device opposite the first carrier substrate, in accordance with an embodiment of the present invention.

Referring to FIG. 12, a second carrier substrate 330 is applied to the device 300. This can include a bonding process using an adhesive.

Figure 13:
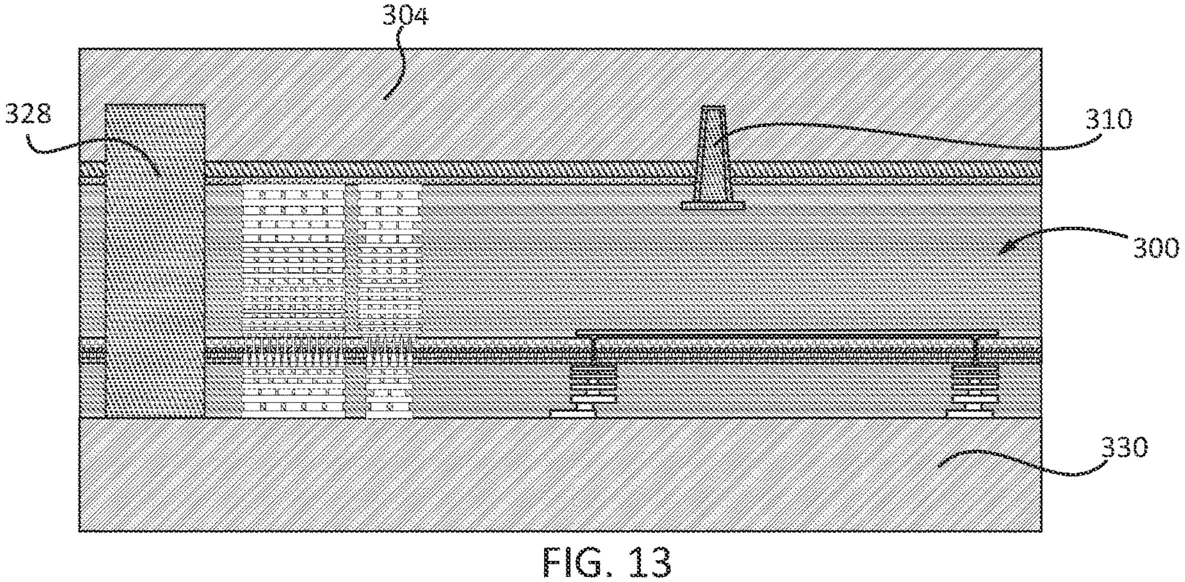
FIG. 13 shows a cross-sectional view of the semiconductor device of FIG. 12 having the semiconductor device flipped, in accordance with an embodiment of the present invention.

Referring to FIG. 13, the device 300 is flipped so that carrier substrate 330 is on the bottom and carrier substrate 304 is on top. This permits processing of the backside of the device.

Figure 14:
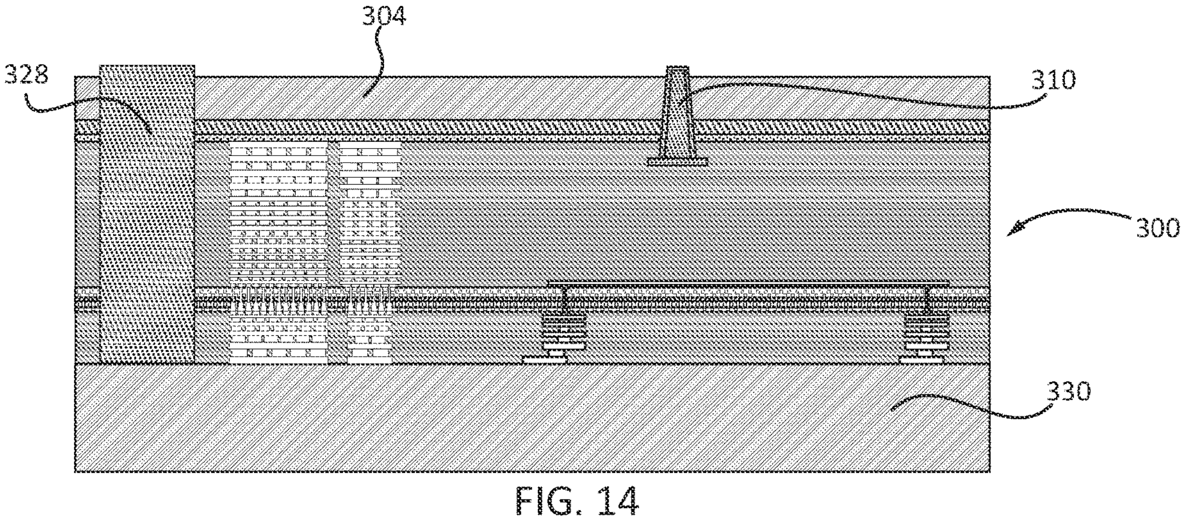
FIG. 14 shows a cross-sectional view of the semiconductor device of FIG. 13 having the first carrier substrate thinned to expose the TSV and the contact, in accordance with an embodiment of the present invention.

Referring to FIG. 14, the carrier substrate 304 is thinned by an etch process, e.g., a wet etch, selective to the TSV 328 and the TSV 310. The etching process exposes the TSV 328 and the TSV 310 to permit electrical connections in the next steps.

Figure 15:
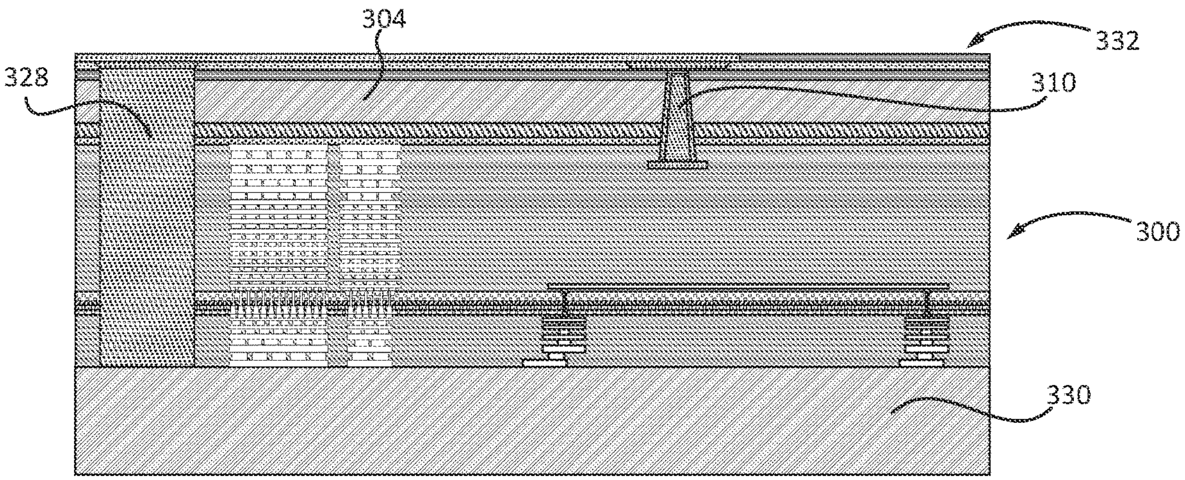
FIG. 15 shows a cross-sectional view of the semiconductor device of FIG. 14 showing construction of metal layers (e.g., redistribution layer (RDL)) on the first carrier, in accordance with an embodiment of the present invention.

Referring to FIG. 15, RDL structures 332 are formed on a backside of the carrier substrate 304. The RDL structures 332 include metal lines and contacts in one or more layers. The RDL structures 332 connect to the TSV 328 and the TSV 310 as needed to form an outside bypass 108 (FIG. 6). RDL structures 332 can be formed by depositing dielectric layers, patterning the dielectric layers to form trenches and holes, filling the trenches with conductive material, and planarizing the conductive material. This process can be repeated from multiple layers of conductive lines. Contacts and connections can be made between layers of metal lines.

Figure 16:
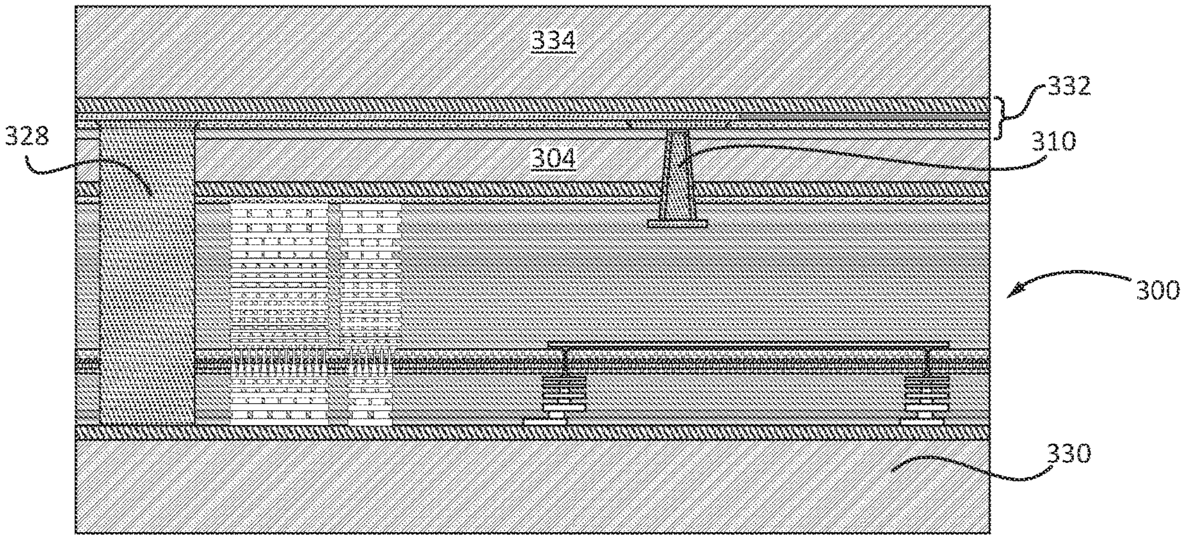
FIG. 16 shows a cross-sectional view of the semiconductor device of FIG. 15 showing a third carrier substrate applied over the metal layers, in accordance with an embodiment of the present invention.

Referring to FIG. 16, a third carrier substrate 334 is bonded onto the RDL structures 332, e.g., using an adhesive. The third carrier substrate 334 protects the RDL structures 332 and permits easier manipulation of the device.

Figure 17:
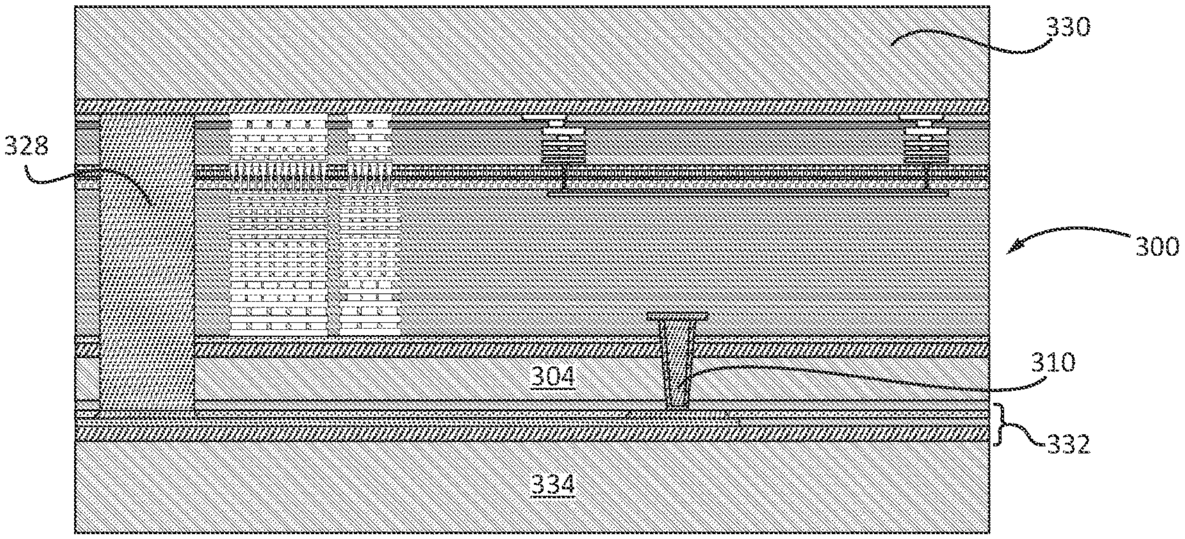
FIG. 17 shows a cross-sectional view of the semiconductor device of FIG. 16 having the semiconductor device flipped, in accordance with an embodiment of the present invention.

Referring to FIG. 17, the device is flipped so that the third carrier substrate 334 is on the bottom the second carrier substrate 330 is on the top.

Figure 18:
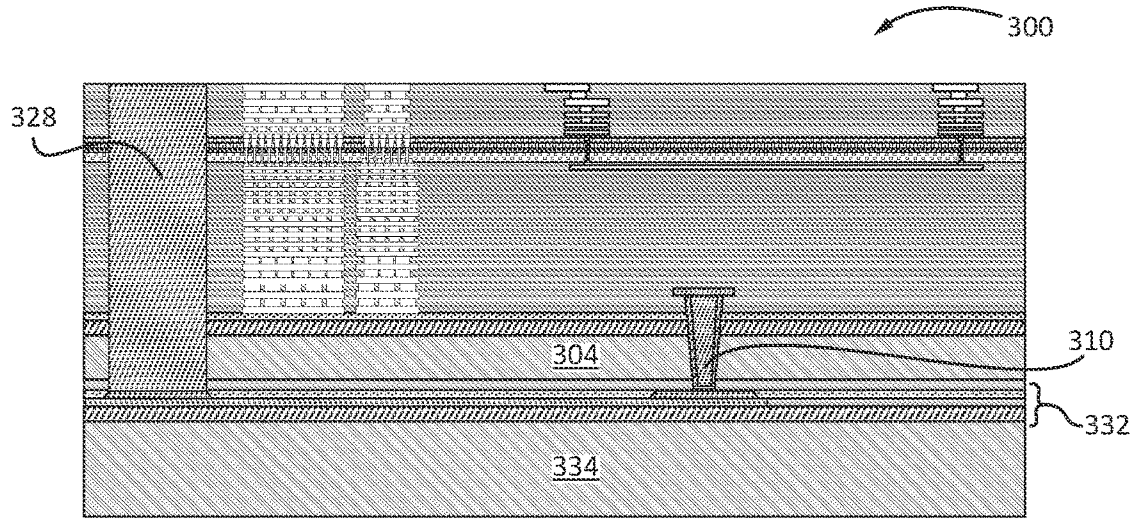
FIG. 18 shows a cross-sectional view of the semiconductor device of FIG. 17 having the second carrier substrate removed, in accordance with an embodiment of the present invention.

Referring to FIG. 18, the second carrier substrate 330 is removed from the top.

Figure 19:
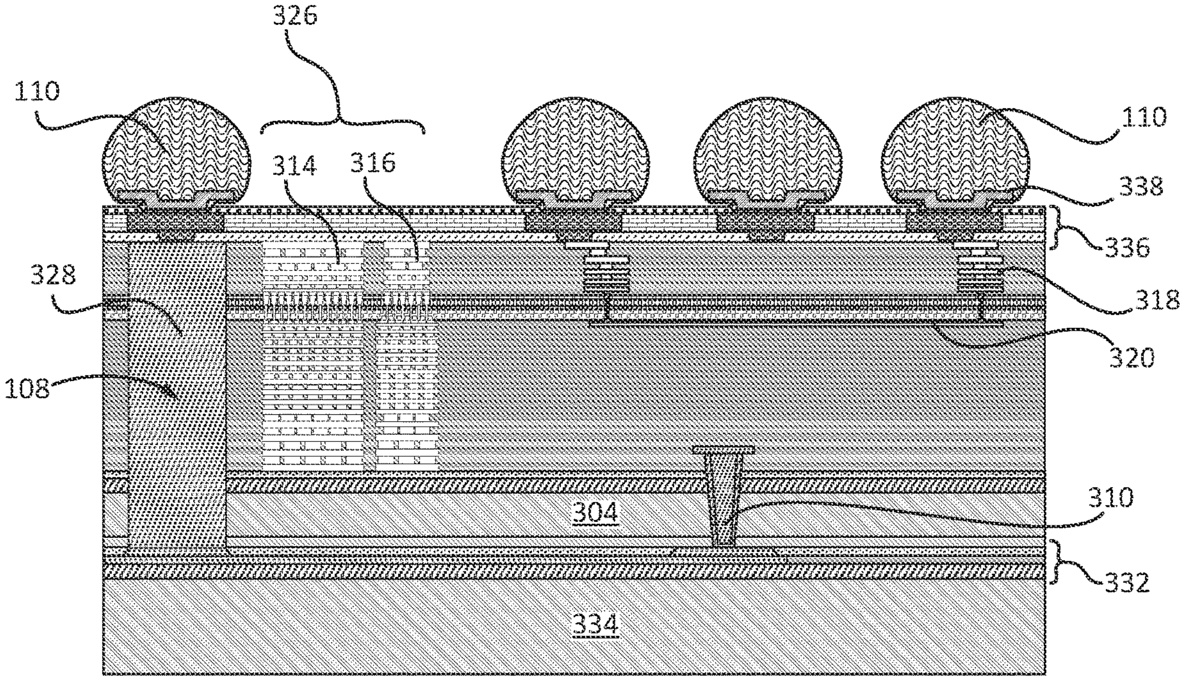
FIG. 19 shows a cross-sectional view of the semiconductor device of FIG. 18 having far back end of the line layers and solder bumps formed, in accordance with an embodiment of the present invention.

Referring to FIG. 19, far back end of line (FBEOL) structures 336 are formed to connected device features with solder bumps 110 (also solder balls). Solder bumps 110 are connected to the FBEOL structures 336 using solder contacts 338. Outside bypasses 108 are formed to bypass the barrier region 326. It should be understood that while outside bypasses 108 are described with respect to this method, inside bypasses 106 can be formed in a same way using the same of similar processing steps. It should be further understood that bot outside bypasses 108 and inside bypasses can be formed concurrently.

Referring to FIGS. 20-34, a method for fabricating a chip with one or more bypasses and having upward contacts is shown in accordance with one illustrative embodiment. This method provides a bypass connection last after semiconductor processing to form an electronic device.

Figure 20:
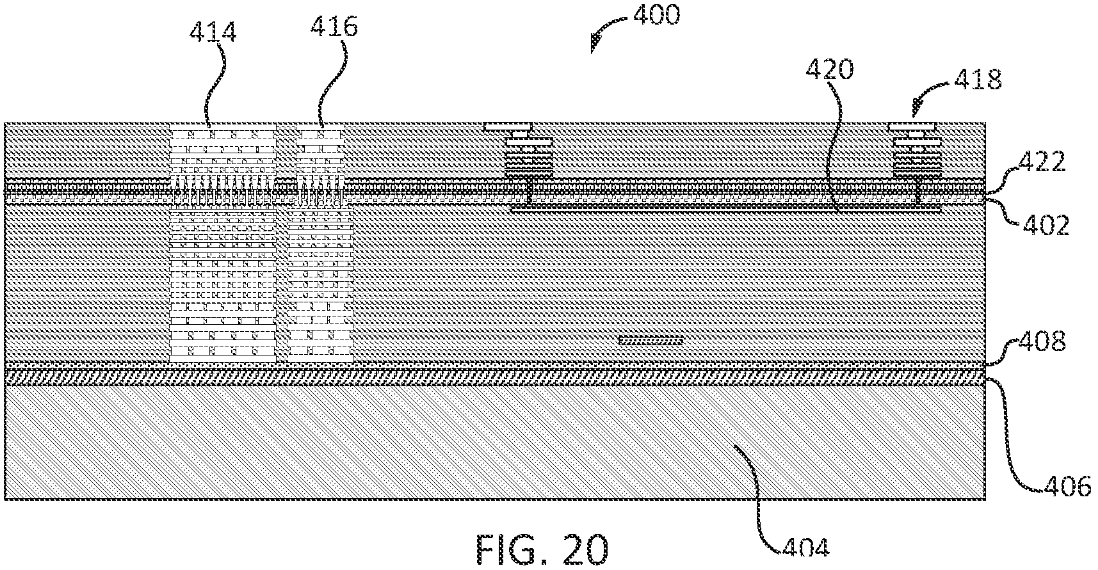
FIG. 20 shows a cross-sectional view of a first carrier substrate having a semiconductor device formed with barrier structures in a bypass connection last method, in accordance with an embodiment of the present invention.

Referring to FIG. 20, a semiconductor device 400 is bonded to a carrier substrate 404. The carrier substrate 404 can be bonded with an adhesive 406 to a capping layer 408, which contacts the semiconductor device 400. The semiconductor device includes a semiconductor substrate 402, which can include any suitable substrate structure, e.g., a bulk semiconductor, a semiconductor-on-insulator (SOI) substrate, etc., as described above.

The semiconductor substrate 402 is processed in accordance with a process of record and in accordance with a device type being manufactured. For example, a nanosheet or nanosheets 422 can be applied to the semiconductor substrate 402 and/or a power distribution network 418 with a buried power rail 420 can be fabricated, as needed. In addition, barrier protection features, such as a crackstop 414 and/or a guard ring 416 are formed.

Semiconductor components, e.g., active regions, such as source/drain regions (S/D regions), gate structures, capacitor plates, memory elements, etc. are formed. Other components can include other electronic and electrical components. Metal structures within dielectric protection layers are also formed.

Figure 21:
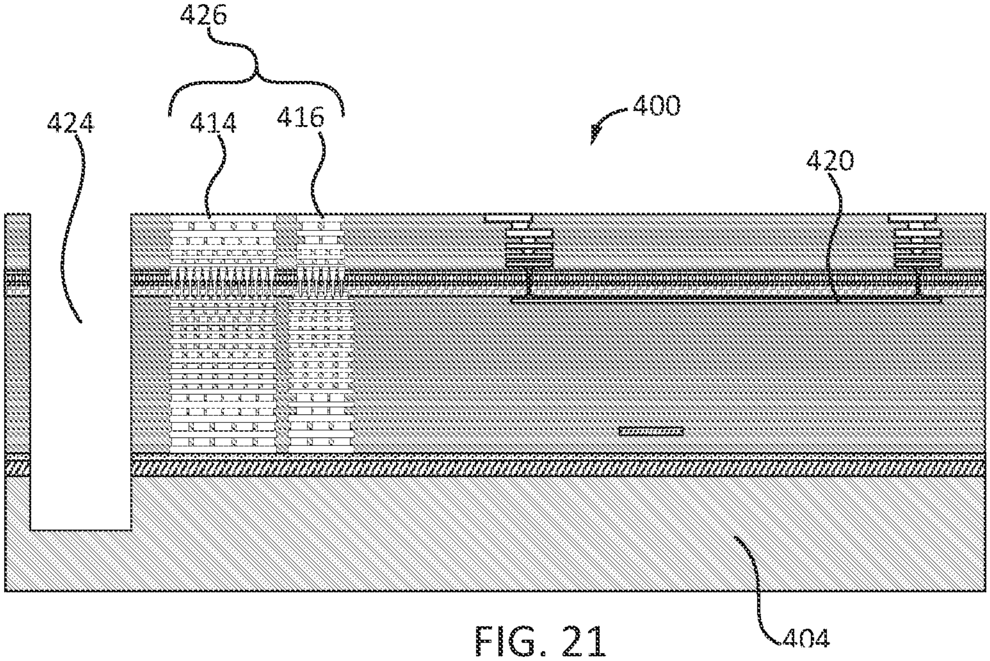
FIG. 21 shows a cross-sectional view of the semiconductor device of FIG. 20 having a TSV hole formed through the prime active region depth outside the barrier structures, in accordance with an embodiment of the present invention.

Referring to FIG. 21, a contact hole 424 is patterned and etched into a partially completed semiconductor device 400 (or device 400). The contact hole 424 can be formed by masking the device 400 and etching the contact hole 424 using an anisotropic etch, such as e.g., RIE. Note that in the present example, the contact hole 424 is formed outside a barrier region 426 that includes the crackstop 414 and the guard ring 416. In this way, the contact hole 424 is intended for the formation of an outside bypass structure.

Figure 22:
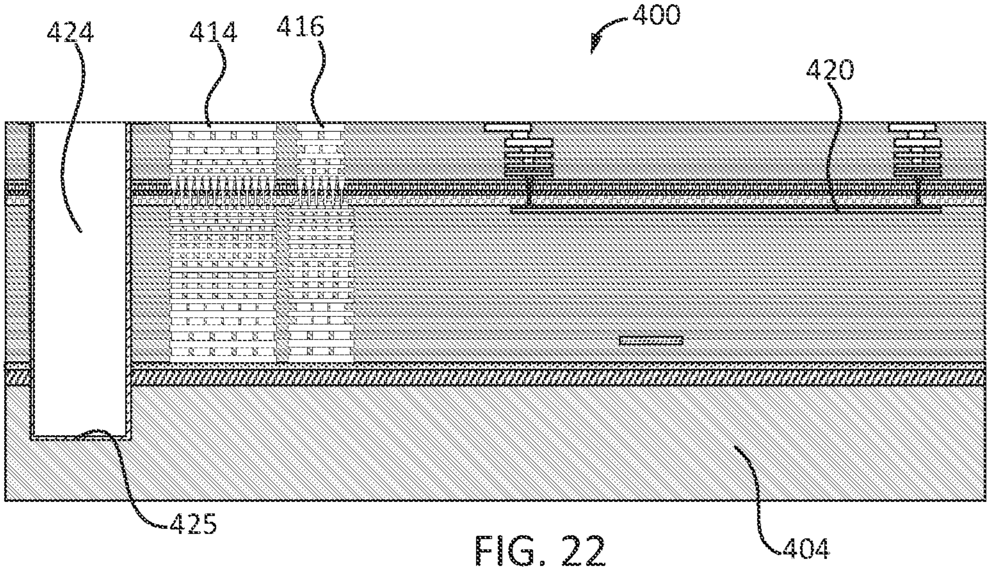
FIG. 22 shows a cross-sectional view of the semiconductor device of FIG. 21 having a liner material formed in the TSV hole, in accordance with an embodiment of the present invention.

Referring to FIG. 22, the contact hole 424 is prepared by sputtering a liner material 425 therein. The liner material 425 can include a diffusion barrier, e.g., TaN, TiN, or the like and a seed layer, which will assist in the formation of a large TSV to be formed. The seed layer is particularly useful in electroplating processes, which is a useful deposition process especially for a large sized contacts.

Figure 23:
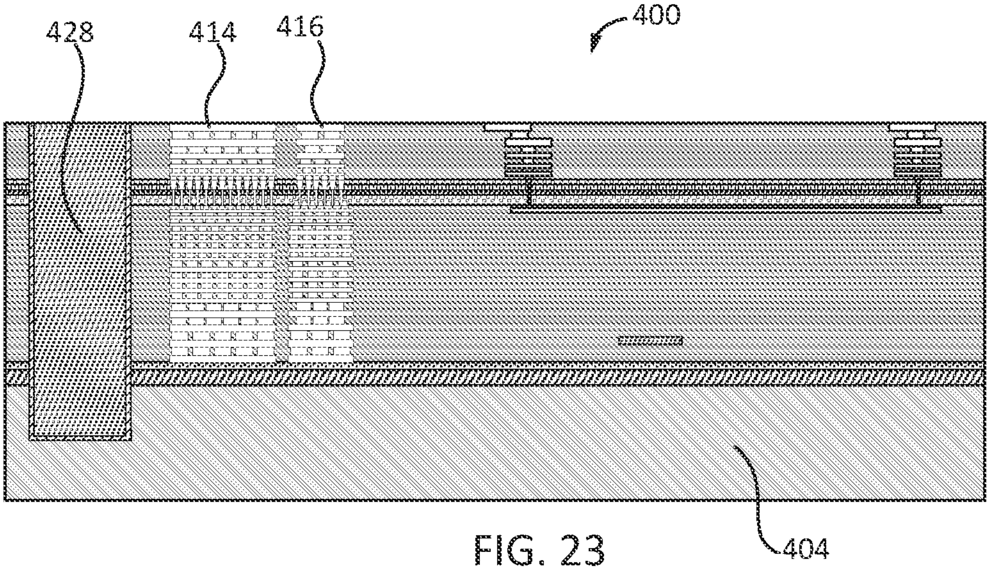
FIG. 23 shows a cross-sectional view of the semiconductor device of FIG. 22 having a TSV formed, in accordance with an embodiment of the present invention.

Referring to FIG. 23, the contact hole 424 is filled with a suitable conductive material. The conductive material can include a metal that can be deposited using, e.g., an electroplating process, although other deposition processes are contemplated. In one embodiment, electroplating can include copper, silver, gold, nickel or any suitable combinations of these and other metals. After deposition, a planarization process is performed, e.g., CMP, to form the TSV 428.

Figure 24:
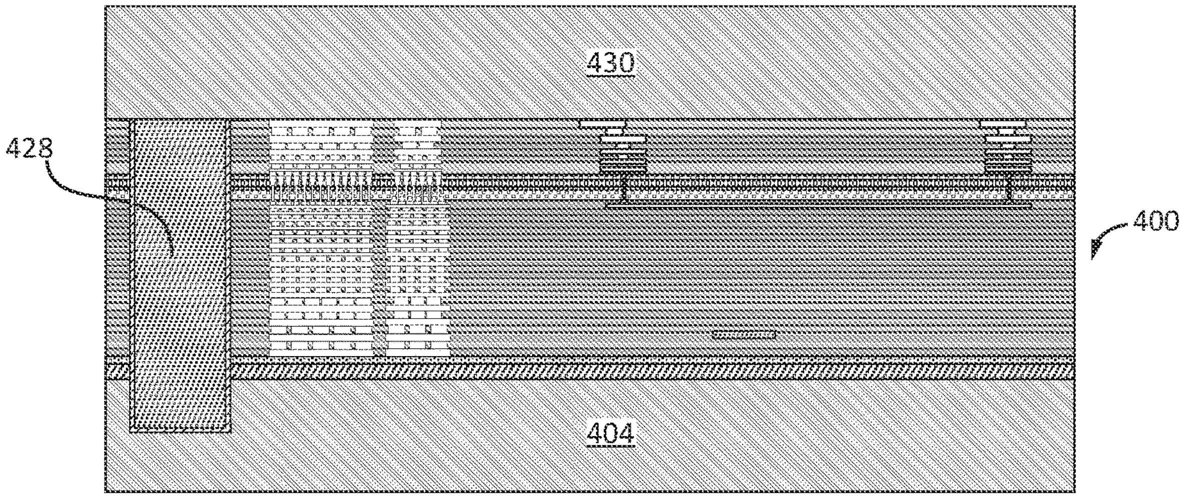
FIG. 24 shows a cross-sectional view of the semiconductor device of FIG. 23 having a second carrier bonded to the semiconductor device opposite the first carrier substrate, in accordance with an embodiment of the present invention.

Referring to FIG. 24, a second carrier substrate 430 is applied to the device 400. This can include a bonding process using an adhesive.

Figure 25:
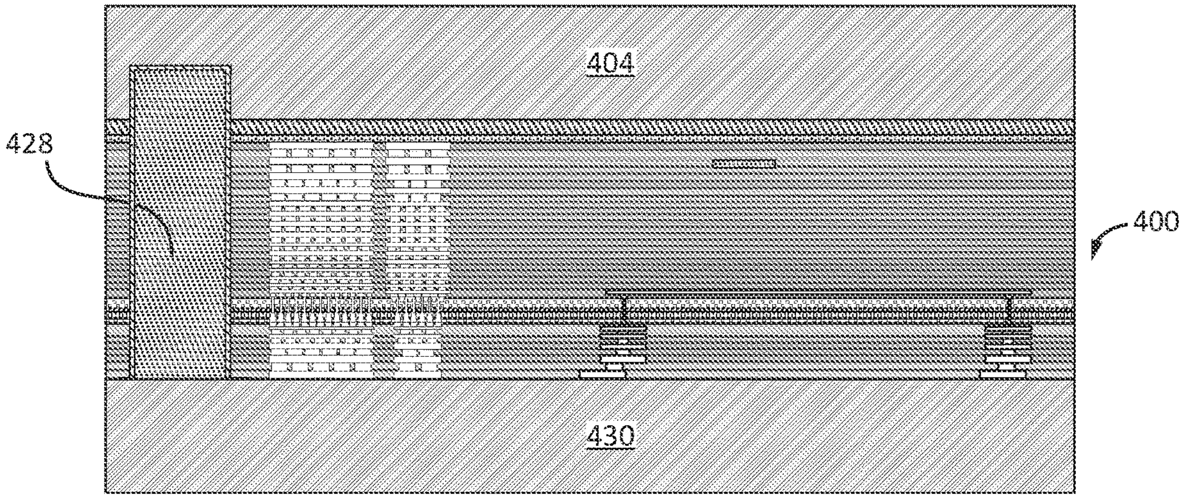
FIG. 25 shows a cross-sectional view of the semiconductor device of FIG. 24 having the semiconductor device flipped, in accordance with an embodiment of the present invention.

Referring to FIG. 25, the device 400 is flipped so that carrier substrate 430 is on the bottom and carrier substrate 404 is on top. This permits processing of the backside of the device.

Figure 26:
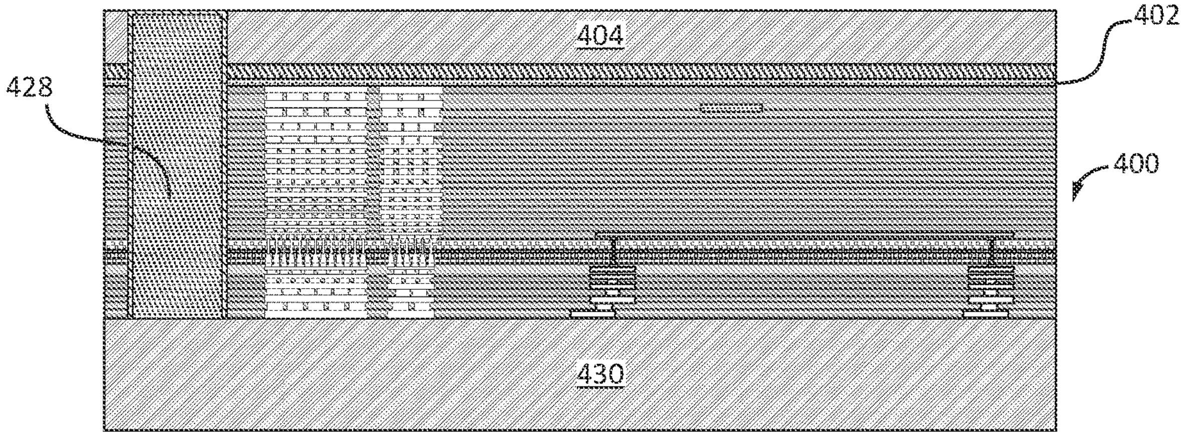
FIG. 26 shows a cross-sectional view of the semiconductor device of FIG. 25 having the first carrier substrate thinned to expose the TSV, in accordance with an embodiment of the present invention.

Referring to FIG. 26, the carrier substrate 404 is thinned by an etch process, e.g., a wet etch, selective to the TSV 428. The etching process exposes the TSV 428 to permit electrical connections in the next steps.

Figure 27:
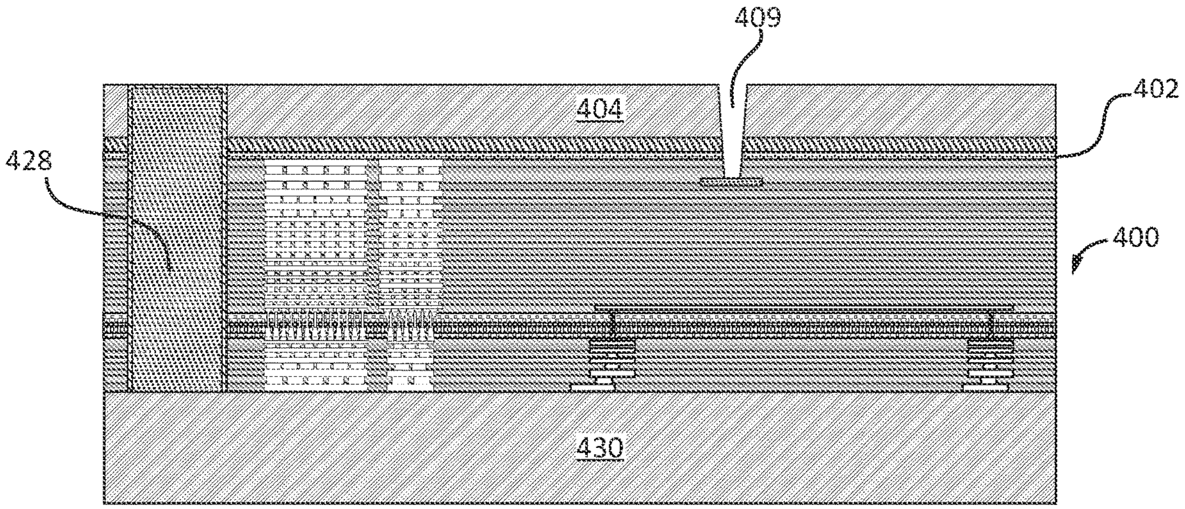
FIG. 27 shows a cross-sectional view of the semiconductor device of FIG. 26 having the first carrier substrate with a contact or TSV hole formed therein in a bypass connection last method, in accordance with an embodiment of the present invention.

Referring to FIG. 27, a through silicon via (TSV) hole 409 is formed by patterning a mask, etching the hole 409 through the carrier substrate 404 and into the semiconductor substrate 402.

Figure 28:
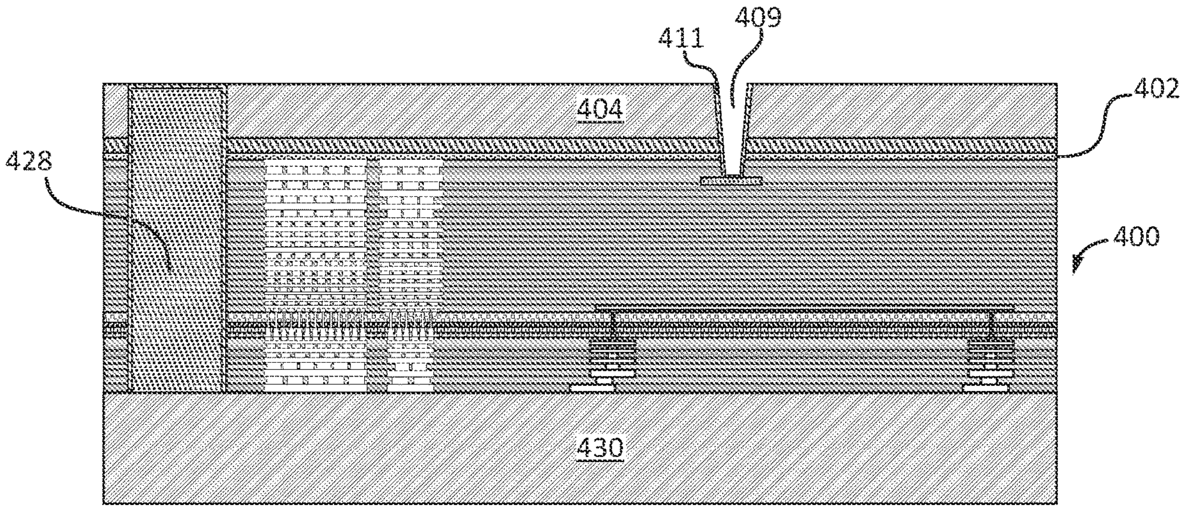
FIG. 28 shows a cross-sectional view of the semiconductor device of FIG. 27 having a liner material formed in the contact or TSV hole, in accordance with an embodiment of the present invention.

Referring to FIG. 28, the hole 409 has a liner material 411 conformally deposited therein. The liner material 411 can be sputtered. The liner material 411 can include a diffusion barrier, e.g., TaN, TiN, or the like and a seed layer, which will assist electroplating a conductor in next steps.

Figure 29:
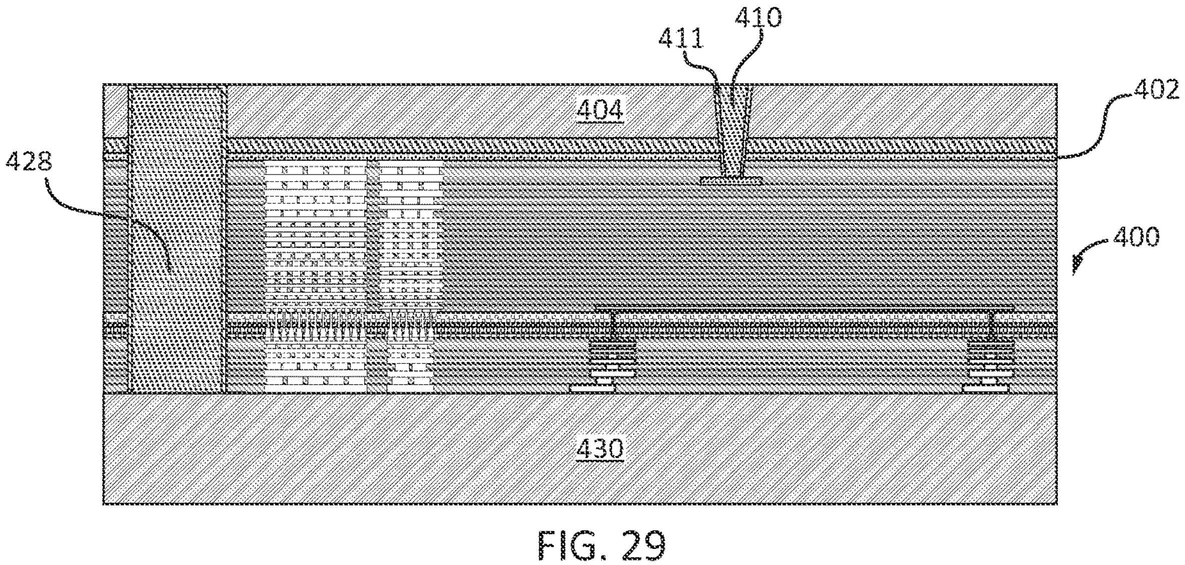
FIG. 29 shows a cross-sectional view of the semiconductor device of FIG. 28 having a contact or TSV formed, in accordance with an embodiment of the present invention.

Referring to FIG. 29, the hole 409 is filled with a suitable conductive material. The conductive material can include a metal that can be deposited using, e.g., an electroplating process, although other deposition processes are contemplated. In one embodiment, electroplating can include copper, silver, gold, nickel or any suitable combinations of these and other metals. After deposition, a planarization process is performed, e.g., CMP, to form the TSV 410.

Figure 30:
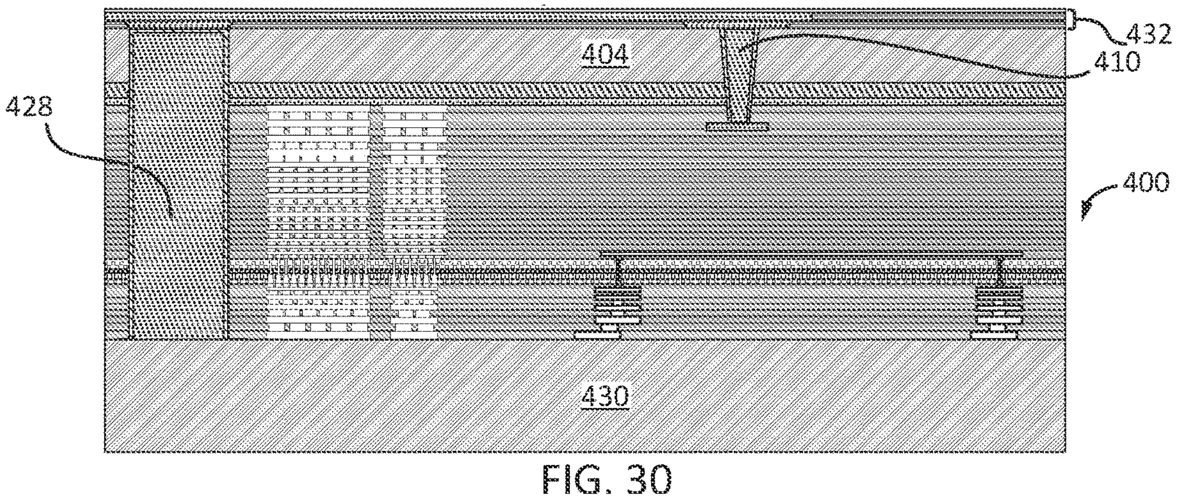
FIG. 30 shows a cross-sectional view of the semiconductor device of FIG. 29 showing construction of metal layers (e.g., RDL) on the first carrier, in accordance with an embodiment of the present invention.

Referring to FIG. 30, RDL structures 432 are formed on a backside of the carrier substrate 404. The RDL structures 432 include metal lines and contacts in one or more layers. The RDL structures 432 connect to the TSV 428 and the TSV 410 as needed to form an outside bypass 108 (FIG. 6). RDL structures 432 can be formed by depositing dielectric layers, patterning the dielectric layers to form trenches and holes, filling the trenches with conductive material, and planarizing the conductive material. This process can be repeated to form multiple layers of conductive lines. Contacts and connections can be made between layers of metal lines.

Figure 31:
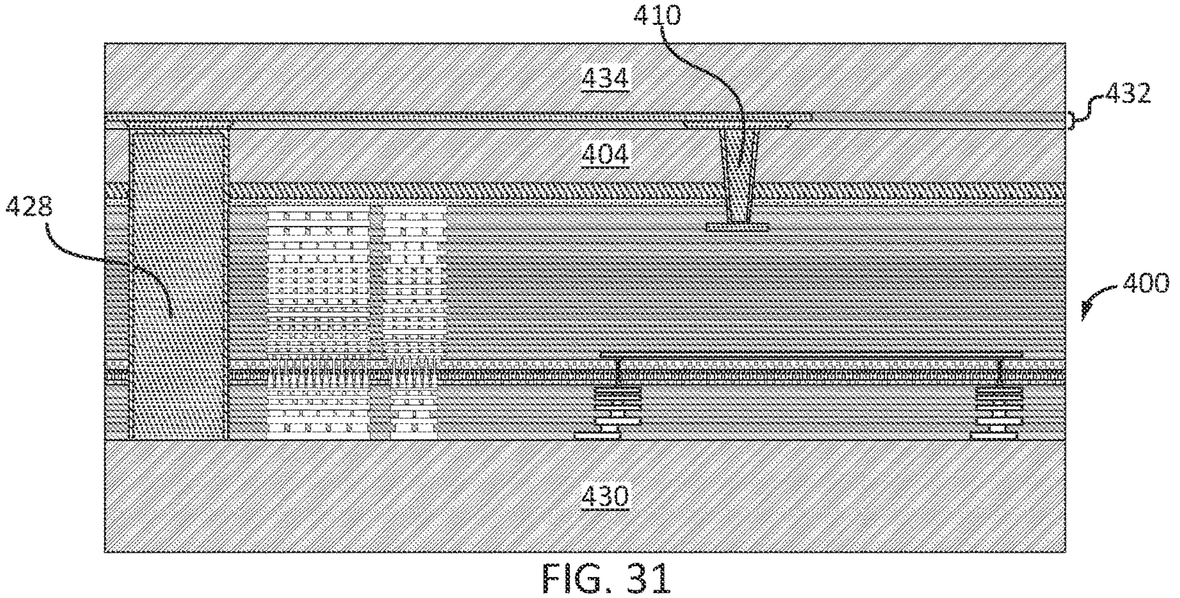
FIG. 31 shows a cross-sectional view of the semiconductor device of FIG. 29 showing a third carrier substrate applied over the metal layers, in accordance with an embodiment of the present invention.

Referring to FIG. 31, a third carrier substrate 434 is bonded onto the RDL structures 432, e.g., using an adhesive. The third carrier substrate 434 protects the RDL structures 432 and permits easier manipulation of the device.

Figure 32:
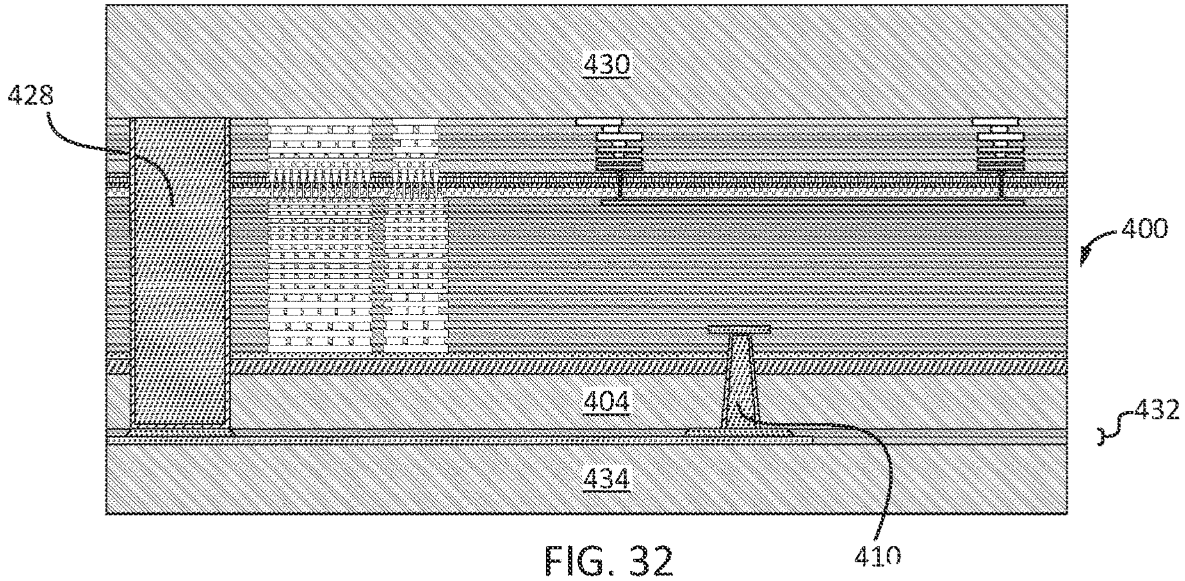
FIG. 32 shows a cross-sectional view of the semiconductor device of FIG. 31 having the semiconductor device flipped, in accordance with an embodiment of the present invention.

Referring to FIG. 32, the device is flipped so that the third carrier substrate 434 is on the bottom and the second carrier substrate 430 is on the top.

Figure 33:
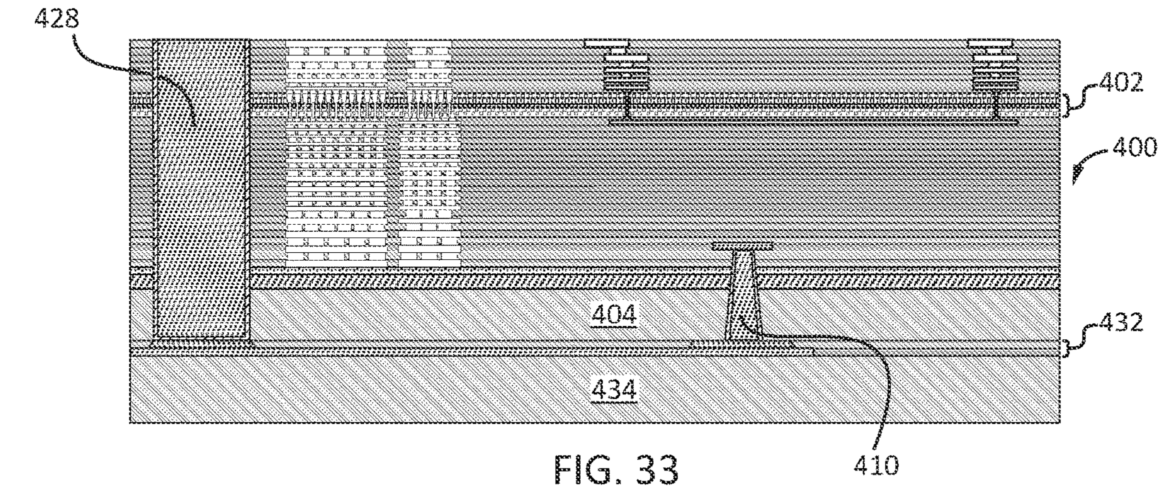
FIG. 33 shows a cross-sectional view of the semiconductor device of FIG. 32 having the second carrier substrate removed, in accordance with an embodiment of the present invention.

Referring to FIG. 33, the second carrier substrate 430 is removed from the top.

Figure 34:
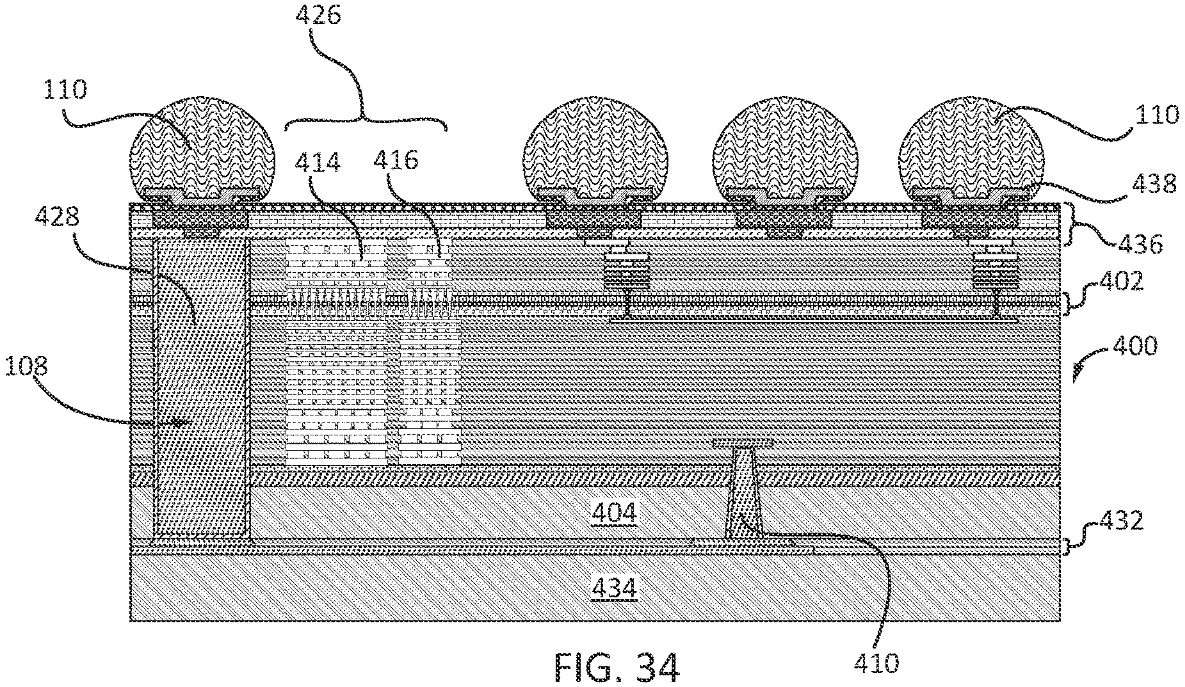
FIG. 34 shows a cross-sectional view of the semiconductor device of FIG. 33 having far back end of the line layers and solder bumps formed, in accordance with an embodiment of the present invention.

Referring to FIG. 34, far back end of line (FBEOL) structures 436 are formed to connected device features with solder bumps 110. Solder bumps 110 are connected to the FBEOL structures 436 using solder contacts 438. Outside bypasses 108 are formed to bypass the barrier region 426. It should be understood that while outside bypasses 108 are described with respect to this method, inside bypasses 106 can be formed in a same way using the same of similar processing steps. It should be further understood that bot outside bypasses 108 and inside bypasses can be formed concurrently.

Figure 35:
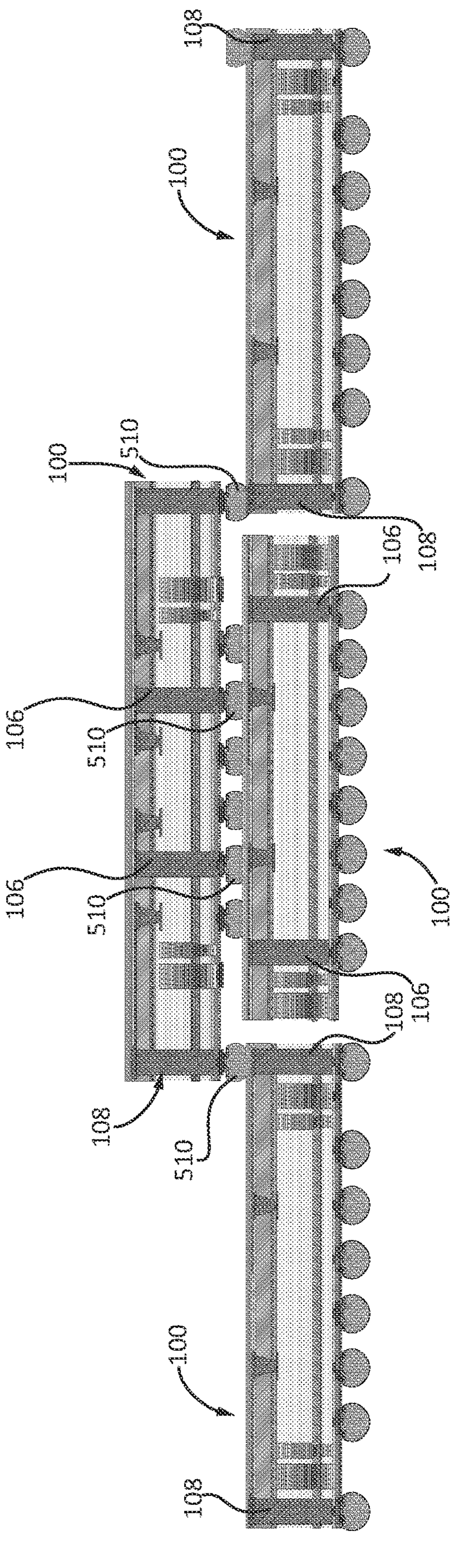
FIG. 35 shows a cross-sectional view of stacked semiconductor devices or chips showing inside and outside bypasses connecting the semiconductor devices or chips, in accordance with an embodiment of the present invention.

Referring to FIG. 35, in one embodiment, outside bypasses 108 and inside bypasses 106 can be employed to connect one or more chips 100. In one embodiment, the outside bypasses 108 and inside bypasses 106 are connected to each other using solder balls 510 employed to connect signal or power between chips 100. In another embodiment, the outside bypasses 108 and inside bypasses 106 can be employed to connect to a single or specific component of one chip 100 to another. It should be understood that many stacking configurations exist and can be employed in accordance with embodiments of the present invention. Further, unique electrical signal connections and power supply connections can be created to route signals and/or power through stacks of the chips 100.

Figure 36:
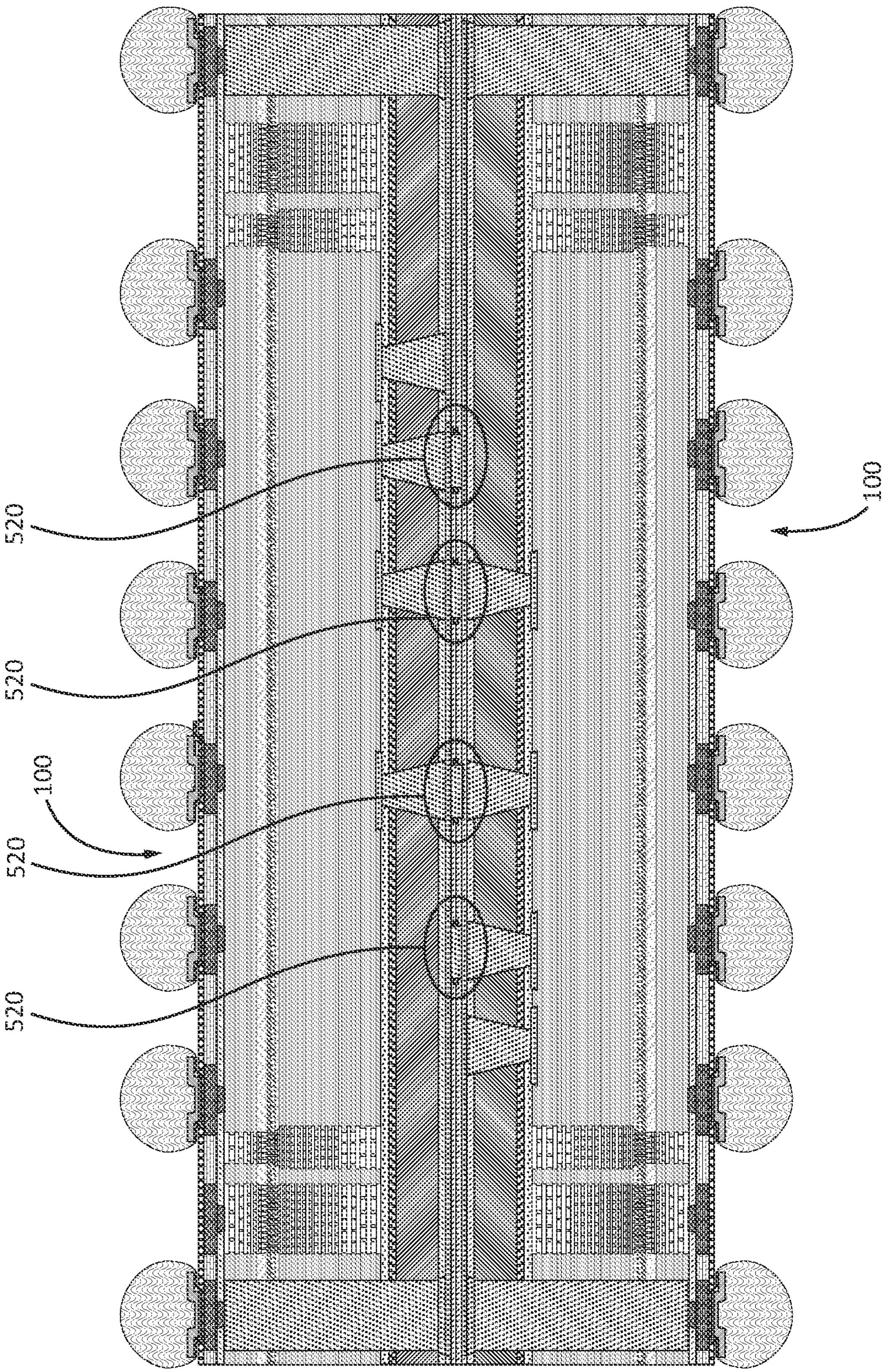
FIG. 36 shows a cross-sectional view of stacked semiconductor devices or chips showing inside and outside bypasses connecting backsides of the semiconductor devices or chips, in accordance with an embodiment of the present invention.

Referring to FIG. 36, in particularly useful embodiments, chips 100 can be stacked backside to backside. In this way, backside wiring on the chips 100 can be maintained as all internal wiring to the respective chip 100 but having direct connections to backside pads or connection points 520 through bypasses (e.g., bypasses 106 and/or 108) between the chips 100. It should be understood that many stacking configurations exist and can be employed in accordance with embodiments of the present invention. Unique electrical signal connections and power supply connections can be created to route signals and/or power through the backsides of the chips 100.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper." "top." "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
an active prime region;
a barrier region within the active prime region to define a barrier through a depth of the active prime region;
a first carrier substrate bonded to the active prime region, the first carrier substrate having a side opposite the active prime region; and
a bypass structure having:
a contact connecting to a component within the active prime region and extending through a depth of the first carrier substrate from the active prime region to the side of the first carrier substrate opposite the active prime region;
a through via passing through the depth of the active prime region and through a depth of the first carrier substrate, the through via connecting to a solder bump; and
a metal layer formed on the side of the first carrier substrate opposite the active prime region and electrically connecting the through via to the contact on the side of the first carrier substrate opposite the active prime region.

2. The semiconductor device as recited in claim 1, wherein the component includes a transistor device.

3. The semiconductor device as recited in claim 1, wherein the through via passes through the active prime region within the barrier region.

4. The semiconductor device as recited in claim 1, wherein the through via passes through the active prime region outside the barrier region.

5. The semiconductor device as recited in claim 1, wherein the semiconductor device includes a plurality of bypass structures, wherein at least one of the plurality of bypass structures includes a through via passing through the active prime region within the barrier region and through the first carrier substrate, and wherein at least one of the plurality of bypass structures includes a through via passing through the active prime region outside the barrier region and through the first carrier substrate.

6. The semiconductor device as recited in claim 1, wherein the bypass structure connects to a second semiconductor device.

7. The semiconductor device as recited in claim 1, wherein the contact extends into the active prime region through back end of line metallization structures.

8. The semiconductor device as recited in claim 1, wherein the contact and the through via each pass through a bonding layer and a capping layer disposed between the first carrier substrate and the active prime region.

9. The semiconductor device as recited in claim 1, wherein the contact and the through via are exposed at the side of the first carrier substrate opposite the active prime region, and wherein the metal layer includes metal lines and contacts in one or more layers that electrically connect the contact and the through via.

10. A semiconductor device, comprising:
an active prime region;
a barrier region within the active prime region to define a barrier across a depth of the active prime region and including at least a crackstop;
a first carrier substrate bonded to the active prime region, the first carrier substrate having a side opposite the active prime region; and
an outside bypass structure having:

a contact connecting to a component within the active prime region and extending through a depth of the first carrier substrate from the active prime region to the side of the first carrier substrate opposite the active prime region;
a through via passing through the depth of the active prime region outside the barrier region and through a depth of the first carrier substrate, the through via connecting to a solder bump; and
a metal layer formed on the side of the first carrier substrate opposite the active prime region and electrically connecting the through via to the contact on the side of the first carrier substrate opposite the active prime region.

11. The semiconductor device as recited in claim 10, wherein the contact extends into the active prime region through back end of line metallization structures.

12. The semiconductor device as recited in claim 10, wherein the contact and the through via each pass through a bonding layer and a capping layer disposed between the first carrier substrate and the active prime region.

13. The semiconductor device as recited in claim 10, wherein the contact and the through via are exposed at the side of the first carrier substrate opposite the active prime region, and wherein the metal layer includes metal lines and contacts in one or more layers that electrically connect the contact and the through via.

14. A method for fabricating a semiconductor device, comprising:
forming a contact through a depth of a first carrier substrate to connect to a component within an active prime region and to extend from the active prime region to a side of the first carrier substrate opposite the active prime region, the active prime region including a barrier region to define a barrier through a depth of the active prime region;
opening a through hole through the depth of the active prime region and through a depth of the first carrier substrate;
filling the through hole to form a through via passing through the depth of the active prime region and through a depth of the first carrier substrate;
forming a metal layer on the side of the first carrier substrate opposite the active prime region to electrically connect the through via to the contact on the side of the first carrier substrate opposite the active prime region; and
forming a solder bump connection to the through via, wherein the contact, the through via, and the metal layer form a bypass structure to provide access to the active prime region.

15. The method as recited in claim 14, wherein forming the contact through the first carrier substrate includes forming the contact before forming the active prime region.

16. The method as recited in claim 14, wherein forming the contact through the first carrier substrate includes forming the contact after forming the active prime region.

17. The method as recited in claim 14, wherein the through via passes through the active prime region within the barrier region.

18. The method as recited in claim 14, wherein the through via passes through the active prime region outside the barrier region.

19. The method as recited in claim 14, wherein the first carrier substrate is bonded to the active prime region with a bonding layer and a capping layer disposed therebetween, and wherein the contact and the through via pass through the bonding layer and the capping layer.

20. The method as recited in claim 14, further comprising thinning the first carrier substrate to expose the contact and the through via at the side of the first carrier substrate opposite the active prime region before forming the metal layer, wherein forming the metal layer includes forming metal lines and contacts in one or more layers that electrically connect the contact and the through via.

* * * * *